US010049761B2

United States Patent
Tokunaga et al.

(10) Patent No.: US 10,049,761 B2
(45) Date of Patent: Aug. 14, 2018

(54) MAGNETIC ELEMENT, SKYRMION MEMORY, SOLID-STATE ELECTRONIC DEVICE, DATA-STORAGE DEVICE, DATA PROCESSING AND COMMUNICATION DEVICE

(71) Applicant: RIKEN, Saitama (JP)

(72) Inventors: Yusuke Tokunaga, Saitama (JP); Xiuzhen Yu, Saitama (JP); Yasujiro Taguchi, Saitama (JP); Yoshinori Tokura, Tokyo (JP); Yoshio Kaneko, Chiba (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/450,024

(22) Filed: Mar. 5, 2017

(65) Prior Publication Data
US 2017/0178747 A1 Jun. 22, 2017

(30) Foreign Application Priority Data
Nov. 6, 2014 (JP) .................... 2014-226235

(51) Int. Cl.
| G11C 19/08 | (2006.01) |
| H01F 10/16 | (2006.01) |
| H01L 43/08 | (2006.01) |
| H01L 43/10 | (2006.01) |
| H01L 27/22 | (2006.01) |

(52) U.S. Cl.
CPC .......... *G11C 19/0841* (2013.01); *G11C 19/08* (2013.01); *H01F 10/16* (2013.01); *H01L 27/228* (2013.01); *H01L 43/08* (2013.01); *H01L 43/10* (2013.01)

(58) Field of Classification Search
CPC .. G11C 19/08; G11C 19/0858; G11C 19/0841
See application file for complete search history.

(56) References Cited

U.S. PATENT DOCUMENTS

| 6,834,005 B1 | 12/2004 | Parkin | |
| 2014/0281464 A1* | 9/2014 | Le | G06F 9/4401 713/2 |

FOREIGN PATENT DOCUMENTS

| JP | 2014-086470 A | 5/2014 |
| JP | 2015-154002 A | 8/2015 |

OTHER PUBLICATIONS

Romming et al., "Writing and Deleting Single Magnetic Skyrmions", Aug. 9, 2013, Science, vol. 341, pp. 636-639.*
Nagaosa et al., "Topological properties and dynamics of magnetic skyrmions", Dec. 4, 2013, Nature Nanotechnology, pp. 899-911.*

(Continued)

*Primary Examiner* — Huan Hoang
*Assistant Examiner* — Jay Radke

(57) ABSTRACT

To provide a magnetic element which can generate a skyrmion, and a skyrmion memory which applies the magnetic element or the like.

To provide a magnetic element with a chiral magnet for generating a skyrmion, the chiral magnet is made of a magnetic material having a β-Mn type crystal structure. Also, to provide a magnetic element with a chiral magnet for generating a skyrmion, the chiral magnet is made of a magnetic material having an $Au_4Al$ type crystal structure.

13 Claims, 43 Drawing Sheets

(56) References Cited

OTHER PUBLICATIONS

Xie et al., "β-Mn-Type Co8+xZn12-x as a Defect Cubic Laves Phase: Site Preferences, Magnetism, and Electronic Structure", ACS Publications, Inorganic Chemistry.*

Tokunaga et al., "A new class of chiral materials hosting magnetic skyrmions beyond room temperature", Nature Communications, Macmillan Publishers Limited, Jul. 2, 2015.*

International Search Report for International Patent Application No. PCT/JP2015/076538, issued by the Japan Patent Office dated Dec. 8, 2015.

Y. Tokunaga et al., A new class of chiral materials hosting magnetic skyrmions beyond room temperature, Nature Communications [online], Jul. 2, 2015 [retrieval date Nov. 25, 2015], Internet: <URL: http://www.nature.com/ncomms/2015/150702/ncomms8638/pdf/ncomms8638.pdf><DOI: 10.1038/ncomms8638>, entire text.

Naoto Nagaosa et al., "Topological properties and dynamics of magnetic skyrmions", Nature Nanotechnology, the United Kingdom, Nature Publishing Group, 2013, Dec. 4, vol. 8, p. 899-911.

K. Karube et al., "Robust metastable skyrmions and their triangular-square lattice structural transition in a high-temperature chiral magnet", nature materials (Sep. 19, 2016), pp. 1237-1243, vol. 15 (Dec. 2016), Macmillan Publishers Limited.

R. Takagi et al., "Spin-wave spectroscopy of the Dzyaloshinskii-Moriya interaction in room-temperature chiral magnets hosting skyrmions", Physical Review B (Jun. 16, 2017), 220406, American Physical Society.

K. Karube et al., "Skyrmion formation in a bulk chiral magnet at zero magnetic field and above room temperature", Physical Review Materials 1 (Dec. 15, 2017), 074405, American Physical Society.

Xiuzhen Yu et al., "Current-Induced Nucleation and Annihilation of Magnetic Skyrmions at Room Temperature in a chiral Magnet", Advanced Science News (Mar. 29, 2017), 1606178, Wiley-VCH Verlag GmbH & Co. KGaA, Weinheim.

Daisuke Morikawa et al., "Deformation of Topologigallly-Protected Supercooled Skyrmions in a Thin Plate of Chiral Magnet Co8Zn8Mn4", Nano Letters (Jan. 30, 2017), pp. 1637-1641, American Chemical Society.

Extended European Search Report issued for counterpart European Application 15856885.7, issued by the European Patent Office dated May 30, 2018.

Claudia Felser, "Skyrmions", Angewandte chemie international edition, Apr. 2, 2013, pp. 1631-1634, vol. 52, No.6, XP_055447056, ISSN: 1433-7851, DOI:10.1002/anie.201207056, Germany.

Kiselev N S et al., "Chiral skymions in thin magnetic films: new objects for magnetic storage technologies?", arXiv.org, Cornell University Library, Feb. 14, 2011, XP_080498864, DOI: 10.1088/0022-3727/44/39/392001,201 Olin library Cornell University Ithaca, NY 14853.

Motohiko Ezawa, "Compact Skyrmions, Merons and Bimerons in Thin Chiral Magnetic Films", arXiv. org, Cornell University Library, Oct. 20, 2010, XP_080457745, DOI: 10.1103/PhysRevB.83.100408, 201 Olin library Cornell University Ithaca, NY 14853.

* cited by examiner

MAGNETIC ELEMENT, SKYRMION MEMORY, SOLID-STATE ELECTRONIC DEVICE, DATA-STORAGE DEVICE, DATA PROCESSING AND COMMUNICATION DEVICE

The contents of the following Japanese patent application(s) are incorporated herein by reference:
NO. 2014-226235 filed in JP on Nov. 6, 2014, and
PCT/JP2015/076538 filed on Sep. 17, 2015,

BACKGROUND

1. Technical Field

The present invention relates to a magnetic element which can generate and erase a skyrmion, a skyrmion memory which uses the magnetic element, a skyrmion memory embedded solid-state electronic device, a data recording apparatus which incorporates a skyrmion memory, a data processing apparatus which incorporates a skyrmion memory, and a communication apparatus which incorporates a skyrmion memory.

2. Related Art

A magnetic element which utilizes a magnetic moment of a magnet as digital information is known. The magnetic element has a nano-scale magnetic structure which functions as an element of a non-volatile memory which does not need an electrical power when holding information. The magnetic element is expected for applications as a large capacity information storage medium due to advantages such as a super-high density by a nano-scale magnetic structure, and its importance as a memory device of an electronics device has been increasing.

As a candidate of a next generation type magnetic memory device, a magnetic shift register is proposed mainly by IBM Corp., U.S. The magnetic shift register drives a magnetic domain wall and transfers its magnetic moment disposition by a current, and reads storage information (refer to Patent Document 1).

FIG. 32 is a schematic view showing a principle of driving of magnetic domain wall by a current. A boundary of a magnetic region in which a direction of magnetic moments is opposite to each other is a domain magnetic wall. In FIG. 32, a domain magnetic wall in a magnetic shift register 1 is shown with solid lines. By flowing a current of the direction of the arrow to the magnetic shift register 1, the magnetic domain wall is driven. By moving of the domain magnetic wall, a magnetism by a direction of the magnetic moment which is located on an upper side of a magnetic sensor 2 changes. The magnetic change is detected by the magnetic sensor 2 and magnetic information is retrieved.

However, the magnetic shift register 1 like this has a disadvantage that a big current is needed when moving the magnetic domain wall, and a transfer rate of the magnetic domain wall is slow. As a result, write and erase time of the memory becomes slow.

The inventors of the present invention proposed a skyrmion magnetic element using a skyrmion which occurs in a magnet as a memory unit (refer to Patent Document 2). In this proposal, the inventors of the present invention showed that the skyrmion can be driven by a current.

PRIOR ART DOCUMENTS

Patent Documents

[Patent Document 1] U.S. Pat. No. 6,834,005
[Patent Document 2] Japanese Patent Application Publication No. 2014-86470
[Non-Patent Document 1] Nagaosa Naoto, Tokura Yoshinori, "Topological properties and dynamics of magnetic skyrmions", Nature Nanotechnology, the United Kingdom, Nature Publishing Group, 2013, Dec. 4, Vol. 8, p 899-911.

Because a skyrmion has an ultra-minute magnetic structure with a diameter from 1 nm to 500 nm, and its structure can be held long hours, so expectations for applications for a memory element have been increasing. However, as a currently-known chiral magnet which generates the skyrmion, there are MnSi, $Fe_{1-x}Co_xSi$, FeGe, and $Mn_{1-x}Ge_xFe$ having B20 type crystal structures and the like (Non-Patent Document 1). A maximum temperature to generate the skyrmion in the B20 type crystal structure is 278K (5 degrees Celsius) of FeGe, and is lower than a room temperature 20 degrees Celsius. Therefore, in order to practically use the skyrmion as a memory element, a crystal structure of chiral magnet which generates the skyrmion at a temperature around a room temperature and is different from the B20 type crystal structure is needed.

SUMMARY

A first aspect of the present invention provides a magnetic element with a chiral magnet for generating a skyrmion, the chiral magnet is made of a magnetic material having a β-Mn type crystal structure or an $Au_4Al$ type crystal structure.

A second aspect of the present invention provides a skyrmion memory having a plurality of magnetic elements which are stacked in a thickness direction described in the first aspect.

A third aspect of the present invention provides a skyrmion memory comprising the magnetic element described in the first aspect and a generating unit of magnetic field which is provided opposite to a chiral magnet and applies a magnetic field to the chiral magnet.

A fourth aspect of the present invention provides a skyrmion memory comprising a substrate, a semiconductor element formed on the substrate, the magnetic element described in the first aspect which is stacked on an upper side of the semiconductor element, and a generating unit of magnetic field which is provided opposite to a chiral magnet and applies a magnetic field to the chiral magnet.

A fifth aspect of the present invention provides a skyrmion memory embedded solid-state electronic device comprising the skyrmion memory described in any of the second aspect to the fourth aspect and a solid-state electronic device within the same chip.

A sixth aspect of the present invention provides a data recording apparatus with the skyrmion memory described in any of the second aspect to the fourth aspect.

A seventh aspect of the present invention provides a data processing apparatus with the skyrmion memory described in any of the second aspect to the fourth aspect.

A seventh aspect of the present invention provides a communication apparatus with the skyrmion memory described in any of the second aspect to the fourth aspect.

DESCRIPTION OF EXEMPLARY EMBODIMENTS

Hereinafter, the present invention is described through the embodiments of the invention. However, the following embodiments do not limit the invention according to the scope of claim. Also, all the combinations of the features described in the embodiments are not necessarily essential to means provided by aspects of the invention.

One example of a magnet which can generate a skyrmion is a chiral magnet. The chiral magnet is a magnet having a chiral crystal structure.

The chiral magnet may often become a magnet in which a magnetic moment disposition when there is no application of an external magnetic field is accompanied by a magnetic ordered phase which rotates on a helix with respect to an advancing direction of the magnetic moment. By applying the external magnetic field, a helical magnetic ordered phase changes into a ferromagnetic phase via a state in which the skyrmion is present.

Figure 1:
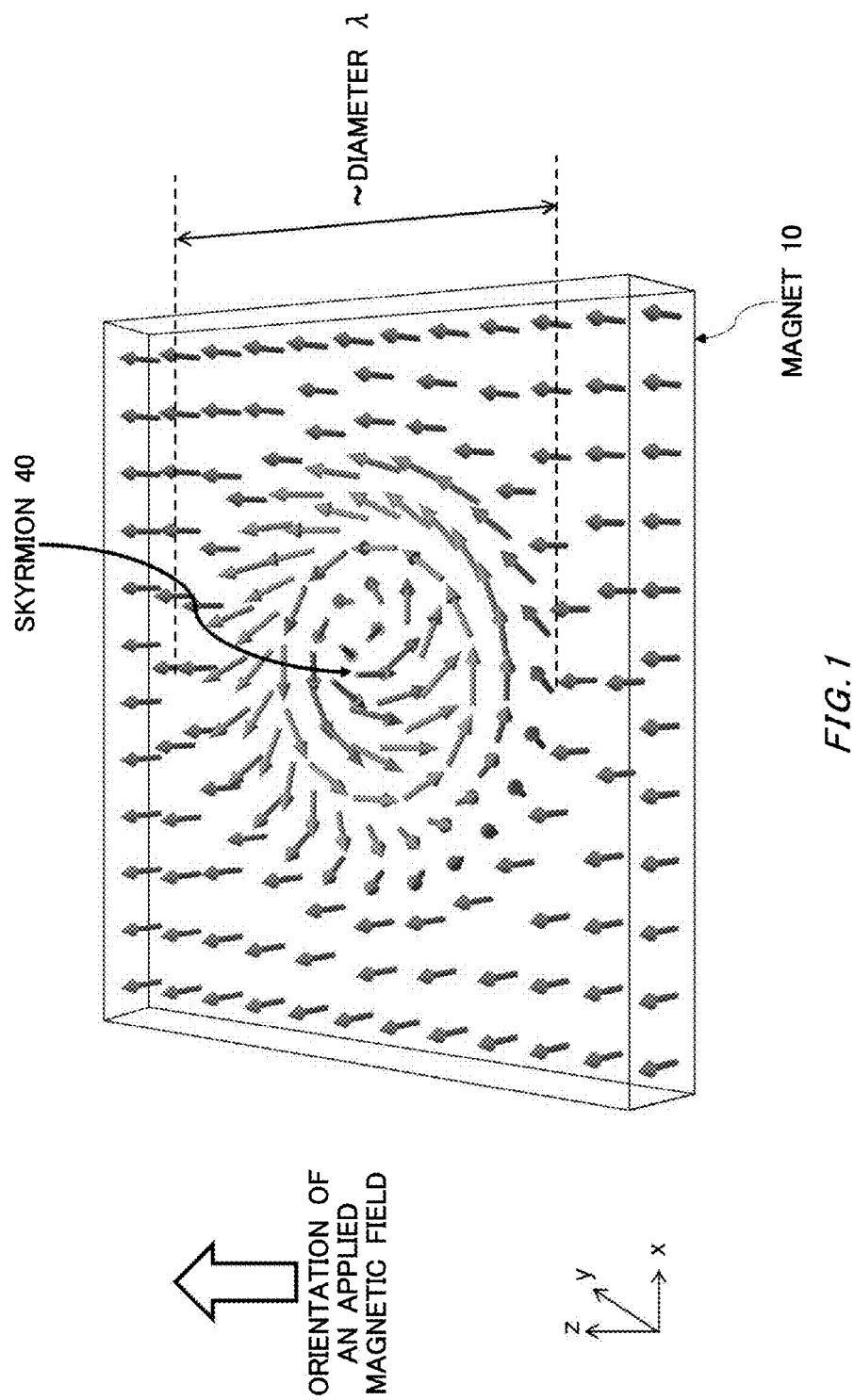
FIG. 1 is a schematic view showing one example of a skyrmion which is a magnetic nano-scale texture of a magnetic moment in a magnet. Intensity and direction of the magnetic moment are schematically shown by arrows.

FIG. 1 is a schematic view showing one example of a skyrmion 40 which is a magnetic nano-scale texture in a magnet 10. In FIG. 1, each arrow indicates the orientations of magnetic moments related to the skyrmion 40. The x-axis and the y-axis are orthogonal to each other, and the z-axis is orthogonal to the xy plane.

The magnet 10 has a plane which is parallel to the x-y plane. Magnetic moments that are oriented in every possible direction on the plane of the magnet 10 configure the skyrmion 40. In the present example, the orientation of a magnetic field applied to the magnet 10 is the positive z-direction. In this case, the magnetic moments at the outermost circumference of the skyrmion 40 in the present example are oriented in the positive z-direction.

At the skyrmion 40, the magnetic moments rotate in a spiral from the outermost circumference toward the inner side. Furthermore, the orientations of the magnetic moments gradually change from the positive z-direction to the negative z-direction along with the rotation in the vortex manner.

At the skyrmion 40, the orientations of the magnetic moments twist continuously between its center and its outermost circumference. That is, the skyrmion 40 is a magnetic nano-scale texture having a vortex structure of magnetic moments. When the magnet 10 in which the skyrmion 40 is present is a thin tabular solid material, the magnetic moments which configure the skyrmion 40 are in the same direction in its thickness direction. That is, magnetic moments in the same direction configure the skyrmion 40 in the depth direction (z-direction) of the plate from the front surface to the rear surface. A diameter 2 of the skyrmion 40 refers to a diameter of the outermost circumference of the skyrmion 40. The outermost circumference in the present example refers to the circumference formed by magnetic moments which are oriented in the same direction with the direction of the external magnetic field shown in FIG. 1.

A number of skyrmion Nsk characterizes the skyrmion 40 which is a magnetic nano-scale texture having a vortex structure. The number of skyrmion can be represented by the following [Equation 1] and [Equation 2]. In [Equation 2], the polar angle Θ(r) between a magnetic moment and the z-axis is a continuous function of the distance r from the center of the skyrmion 40. The polar angle Θ(r) changes from π to zero or from zero to π when r is changed from 0 to ∞.

$$Nsk = \frac{1}{4}\pi \int\int d^2 r n(r) \cdot \left[\left(\frac{\partial n(r)}{\partial x}\right) \times \left(\frac{\partial n(r)}{\partial y}\right)\right] \quad \text{[Equation 1]}$$

$$n(r) = (\cos\Phi(\varphi)\sin\Theta(r), \sin\Phi(\varphi)\sin\Theta(r), \cos\Theta(r)) \quad \text{[Equation 2]}$$

$$\Phi(\varphi) = m\varphi + \gamma$$

In [Equation 1], the n(r) is a unit vector which shows a direction of the magnetic moment of the skyrmion 40 at a location r. In [Equation 2], m is voracity, and γ is helicity. Based on [Equation 1] and [Equation 2], when Θ(r) changes from π to zero by changing r from zero to ∞, Nsk=−m.

Figure 2:
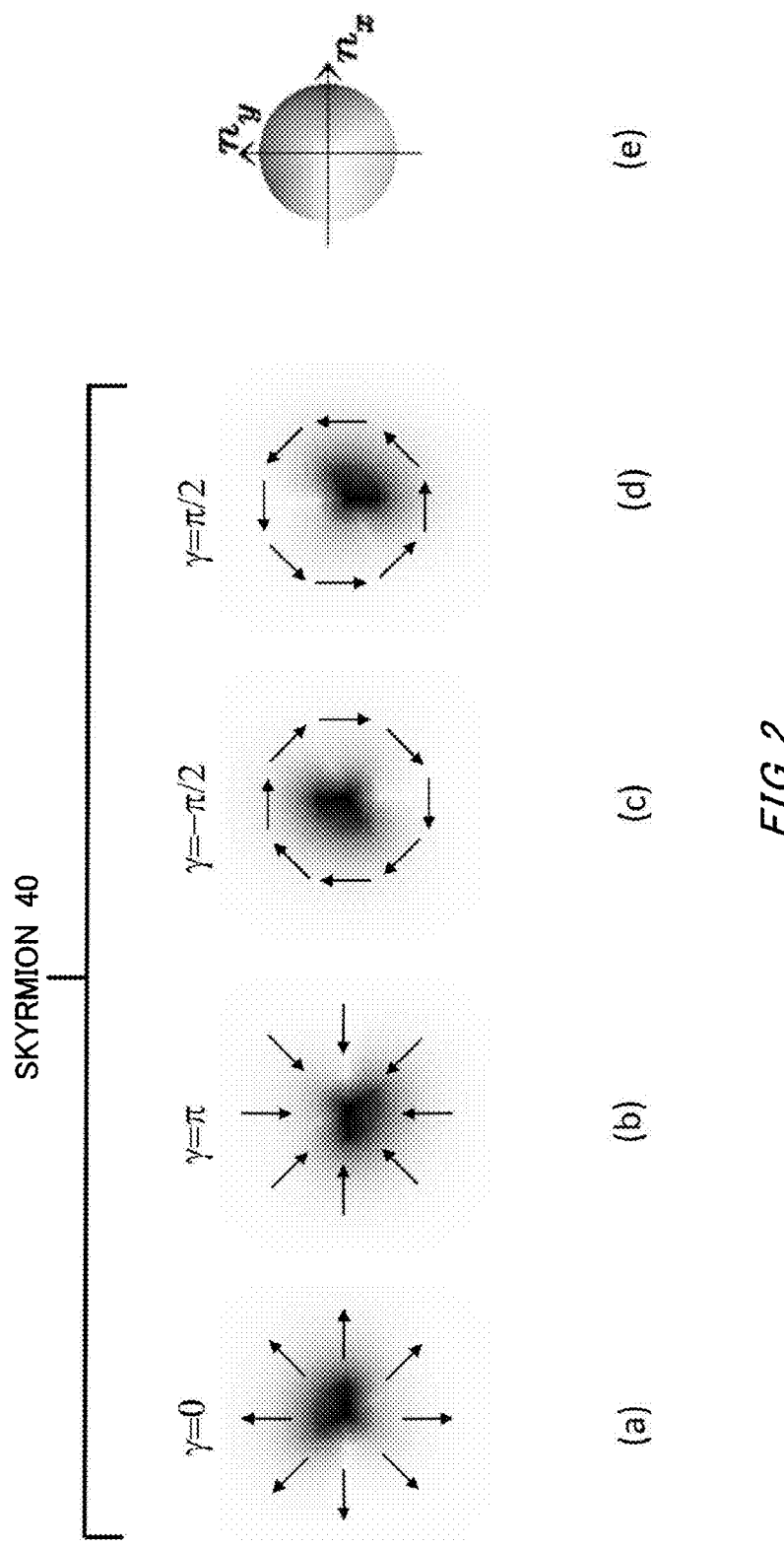
FIG. 2 shows a skyrmion having different helicity γ.

FIG. 2 is a schematic view showing a skyrmion 40 having different helicity γ (Non-Patent Document 1). In particular, one example in cases of the number of skyrmion Nsk=−1 is shown in FIG. 2. FIG. 2(e) shows how the coordinates of a magnetic moment n are defined (right-handed system). Note that because it is a right-handed system, the $n_z$-axis is in a direction from the rear to the front on the surface of the sheet of paper relative to the $n_x$-axis and the $n_y$-axis. In FIG. 2(a) to FIG. 2(e), shading indicates the orientations of magnetic moments.

The magnetic moment indicated by shading on the circumference in FIG. 2(e) has a direction on the $n_x$-$n_y$ plane. In response to the above, the magnetic moment indicated by the lightest shading (white) of the circle center in FIG. 2(e) has a direction from the rear side to the front side of the sheet of paper. The angle relative to the $n_z$-axis of the magnetic moments shown by shading at each location between the circumference and the center is from π to zero depending on the distance from the center. Orientations of each magnetic moment in FIG. 2(a) to FIG. 2(d) are shown by the same shading in FIG. 2(e). Note that like the center of the skyrmion 40 in FIG. 2(a) to FIG. 2(d), the magnetic moment indicated by the darkest shading (black) has a direction from the front of the sheet of paper to the rear of the sheet of paper. Each arrow in FIG. 2(a) to FIG. 2(d) indicates a magnetic moment that is at a predetermined distance from the center of the magnetic texture. The magnetic textures shown in FIG. 2(a) to FIG. 2(d) are in a state which can be defined as the skyrmions 40.

In FIG. 2(a)(γ=0), the shading at the predetermined distance from the center of the skyrmion 40 matches the shading on the circumference of FIG. 2(e). For this reason, the directions of the magnetic moments shown by arrows in FIG. 2(a) are oriented in a radial direction from the center to the outer side. The orientation of each magnetic moment in FIG. 2(b)(γ=π) relative to each magnetic moment in FIG. 2(a)(γ=0) is an orientation obtained by rotating each magnetic moment in FIG. 2(a) by 180°. The orientation of each magnetic moment in FIG. 2(c)(γ=−π/2) relative to each magnetic moment in FIG. 2(a)(γ=0) is an orientation obtained by rotating each magnetic moment in FIG. 2(a) by −90 degrees (90 degrees clockwise).

The orientation of each magnetic moment in FIG. 2(d) (γ=π/2) relative to each magnetic moment in FIG. 2(a)(γ=0) is an orientation obtained by rotating each magnetic moment in FIG. 2(a) by 90 degrees (90 degrees counterclockwise).

Note that the skyrmion with the helicity γ=π/2 shown in FIG. 2(d) corresponds to the skyrmion 40 in FIG. 1.

Although the four exemplary magnetic structures shown in FIG. 2(a) to FIG. 2(d) seem different, but are topologically identical magnetic textures.

The skyrmions 40 having structures shown in FIG. 2(a) to FIG. 2(d) are, once generated, stably present, and function as a carrier to convey information in the magnet 10 to which an external magnetic field is applied.

However, a currently-known chiral magnet alloy which generates a skyrmion 40 has been limited to the B20 type crystal structure (Non-Patent Document 1). A magnet which has the highest temperature to generate the skyrmion 40 among the B20 type crystal structures is FeGe, and is 278K (5 degrees Celsius). As a crystal structure of chiral magnet which can generate the skyrmion 40 at the temperature around the room temperature 20 degrees Celsius, there are a β-Mn type crystal structure and an $Au_4Al$ type crystal structure.

The β-Mn type crystal structure belongs to $P4_132$ or $P4_332$ space group, and is different from a B20 type crystal structure which has a crystal structure of $P2_13$ space group. The $Au_4Al$ type crystal structure belongs to a $P2_13$ space group, but is different from the B20 type crystal structure which has the same crystal structure of $P2_13$ space group. Next, the fact that a material which has the β-Mn type crystal structure and a material which has the $Au_4Al$ type crystal structure have a crystal phase of skyrmion which is above zero temperature is shown by implementation examples.

Implementation Example 1

A material which has the β-Mn type crystal structure which is a chiral magnet has a crystal phase of skyrmion above zero temperature. As a chemical compound which is the β-Mn type crystal structure, there is a material which is made of a $Co_xZn_yMn_z$, and satisfies x+y+z=20 and 0≤x, y, z≤20. As a more specific example, there is a $Co_8Zn_8Mn_4$. The $Co_8Zn_8Mn_4$ has a skyrmion crystal at 300K (27 degrees Celsius).

Figure 3:
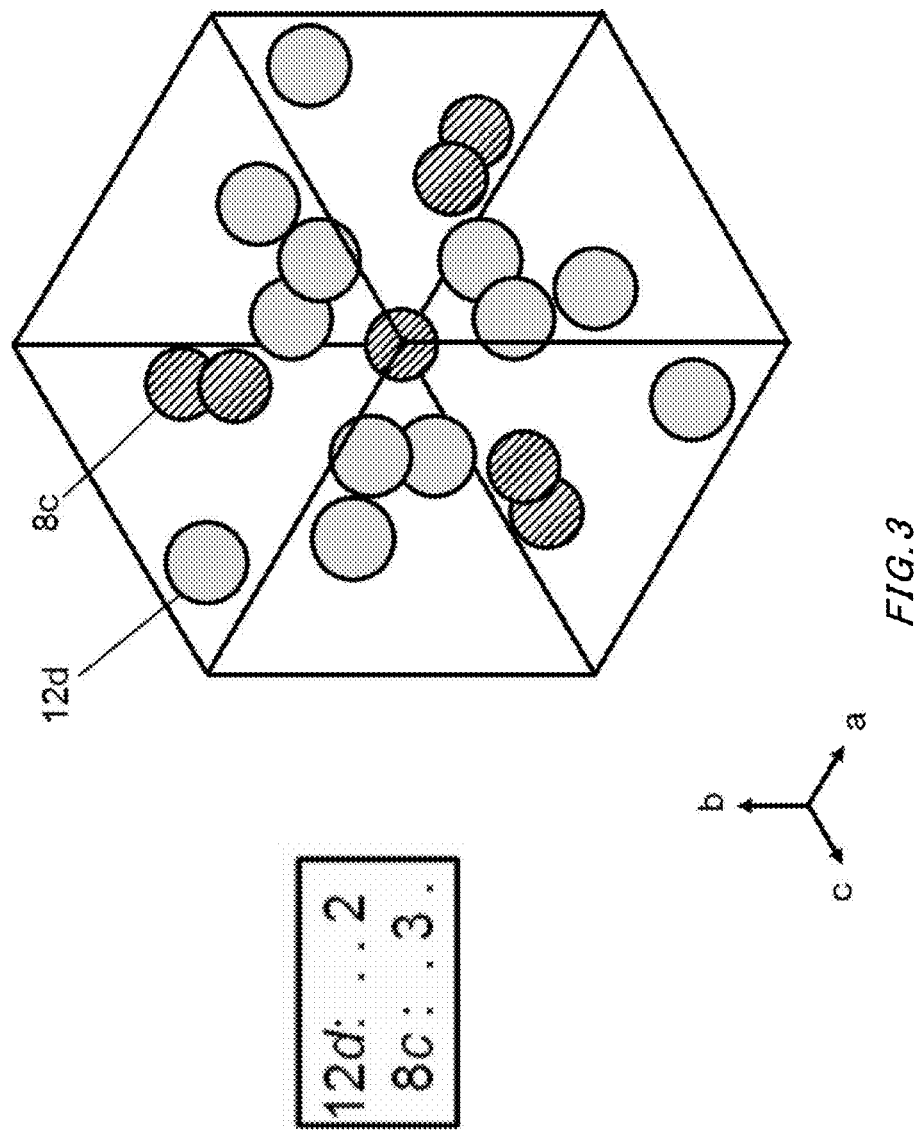
FIG. 3 shows a β-Mn type crystal structure.

FIG. 3 shows a β-Mn type crystal structure. The β-Mn type crystal structure is a crystal structure of $P4_132$ or $P4_332$ space group which has a chiral (helical) structure. Helical structures of the crystal structure of $P4_132$ space group and the crystal structure of $P4_332$ are in mirror symmetrical relation. Helical structural β-Mn type crystal structure is a cubic structure which has 20 atoms in a unit cell. 20 elements are made of eight c-sites having an equivalent spatial disposition and twelve d-sites having an equivalent spatial disposition. The c-sites are located on the three-fold rotation axis, and the d-sites are located on the two-fold rotation axis. FIG. 3 shows a β-Mn type crystal structure which is seen from the [111] direction of a single c-site, and has a three-fold symmetrical property which 20 elements respectively overlap the original crystal locations after rotating with 120 degrees with respect to the 111-axis. Every c-site is located on the three-fold rotation axis.

Figure 4:
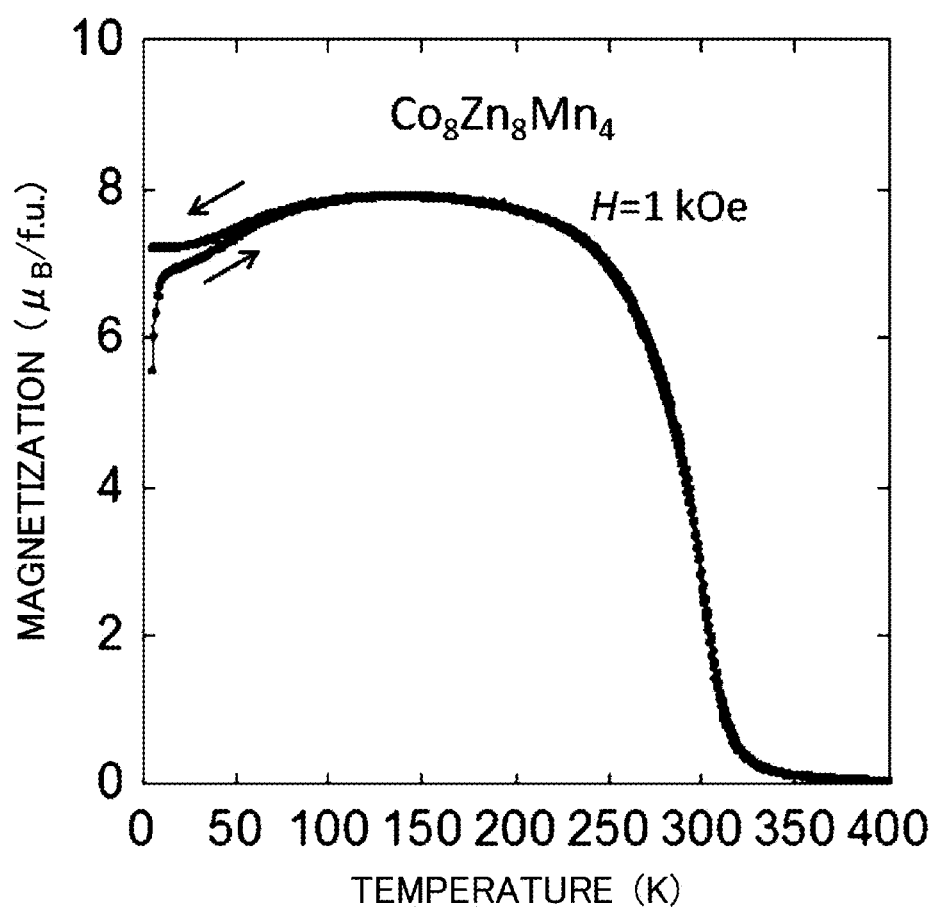
FIG. 4 shows a temperature dependency of a magnetization being made of a $Co_8Zn_8Mn_4$.
Figure 5A:
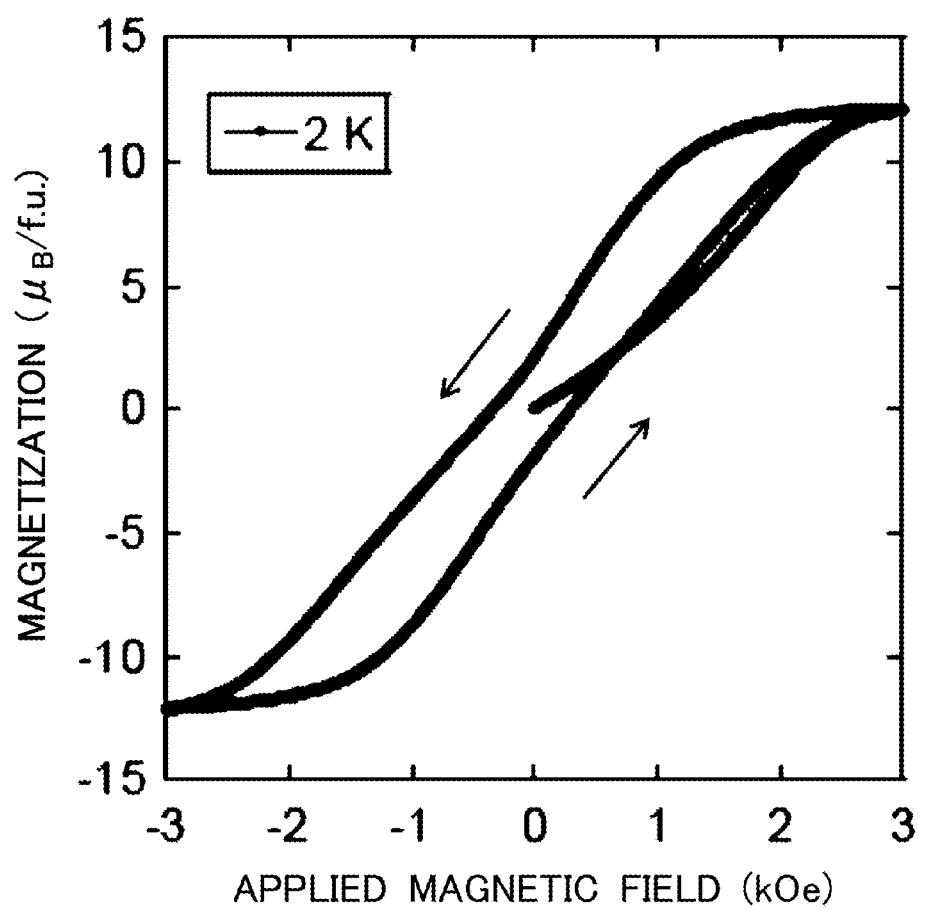
FIG. 5A shows a magnetic field dependency of a magnetization of a $Co_8Zn_8Mn_4$ at 2K.
Figure 5B:
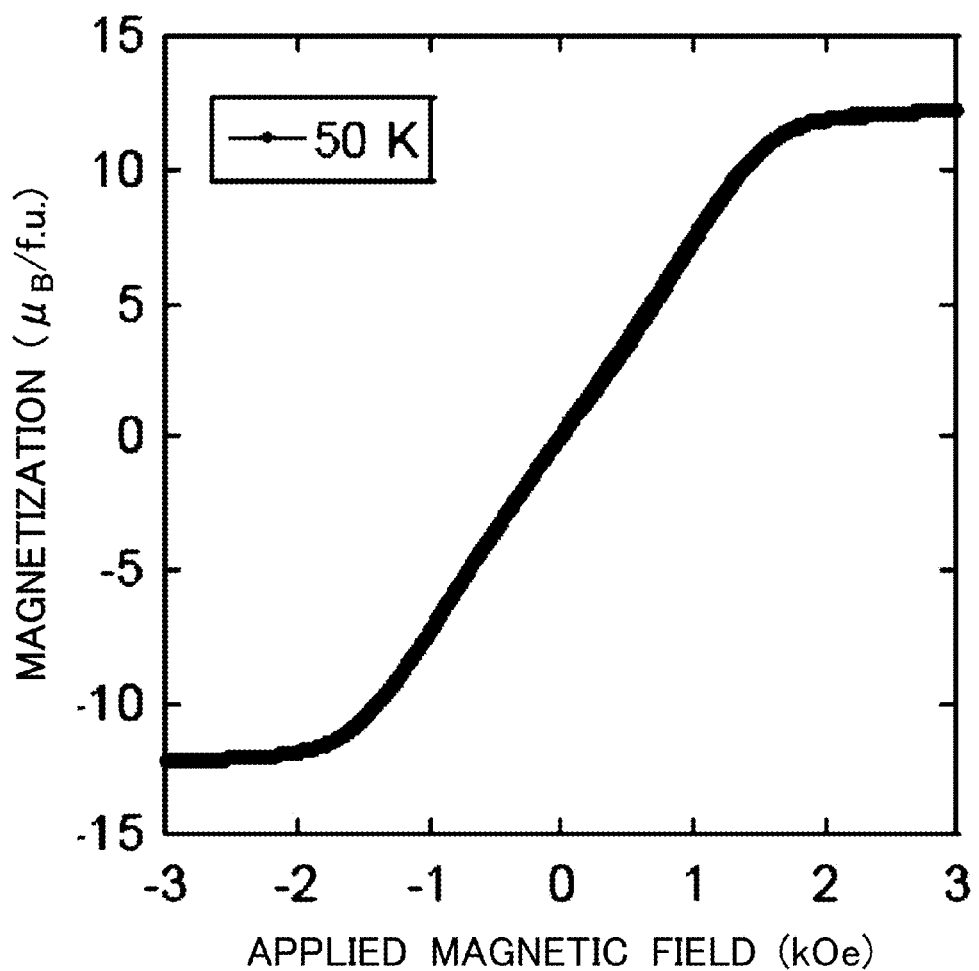
FIG. 5B shows a magnetic field dependency of a magnetization of a $Co_8Zn_8Mn_4$ at 50K.
Figure 5C:
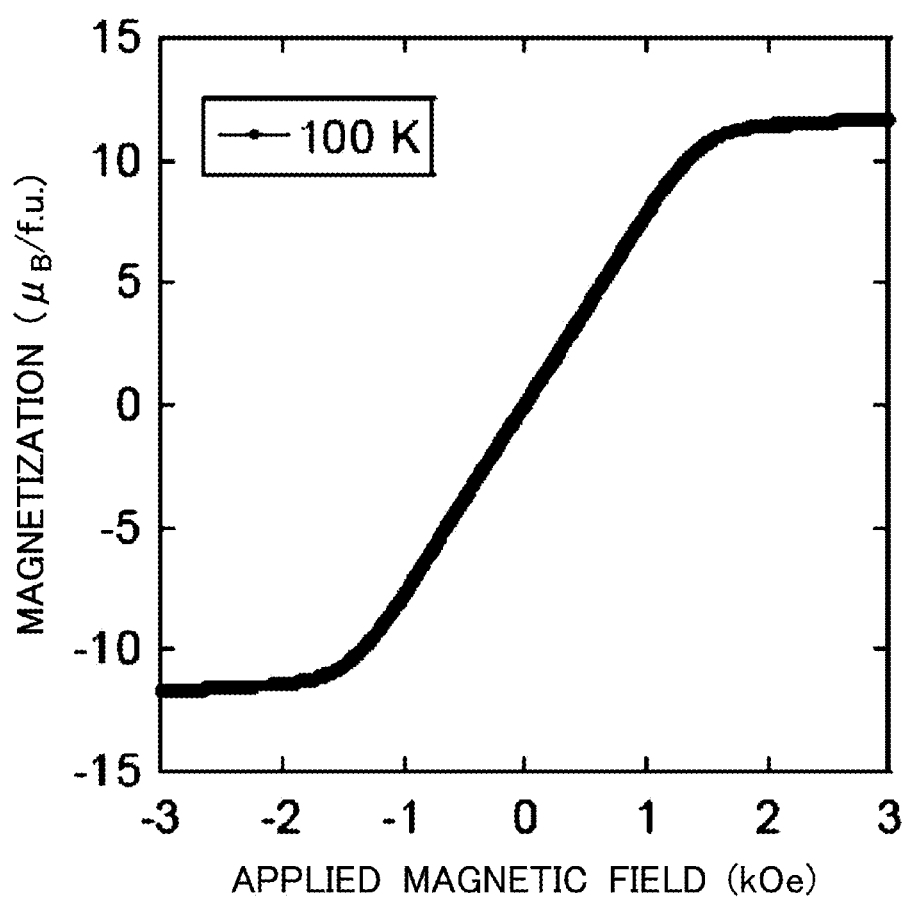
FIG. 5C shows a magnetic field dependency of a magnetization of a $Co_8Zn_8Mn_4$ at 100K.
Figure 5D:
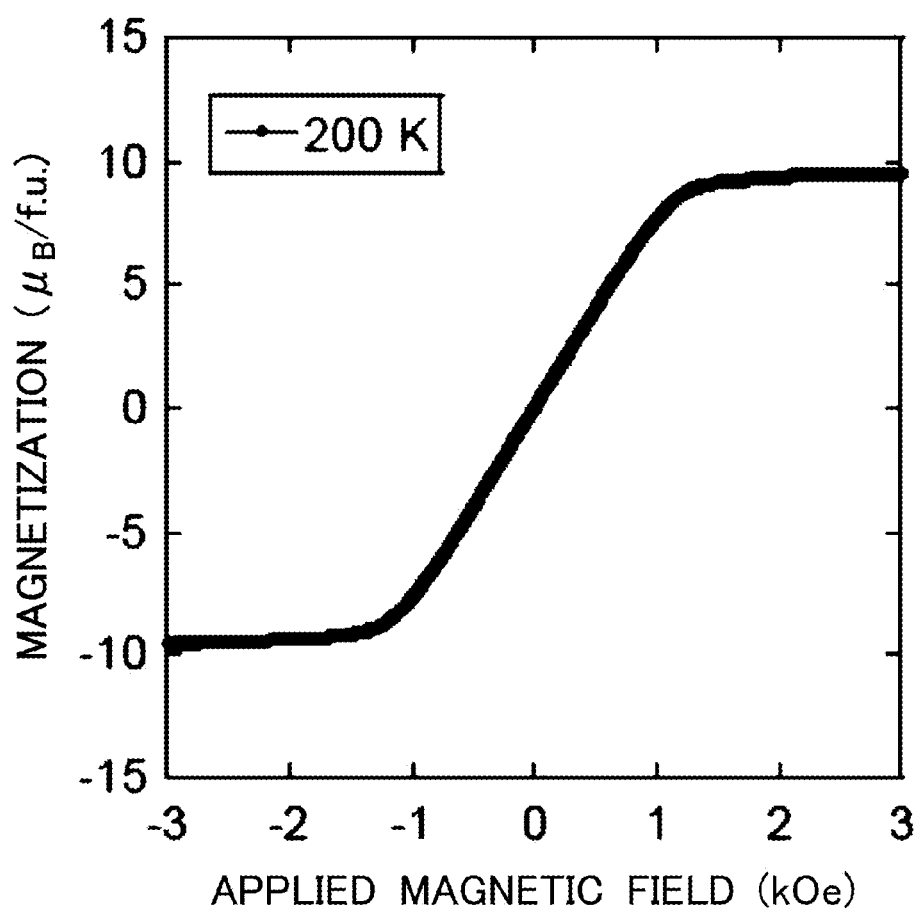
FIG. 5D shows a magnetic field dependency of a magnetization of a $Co_8Zn_8Mn_4$ at 200K.
Figure 5E:
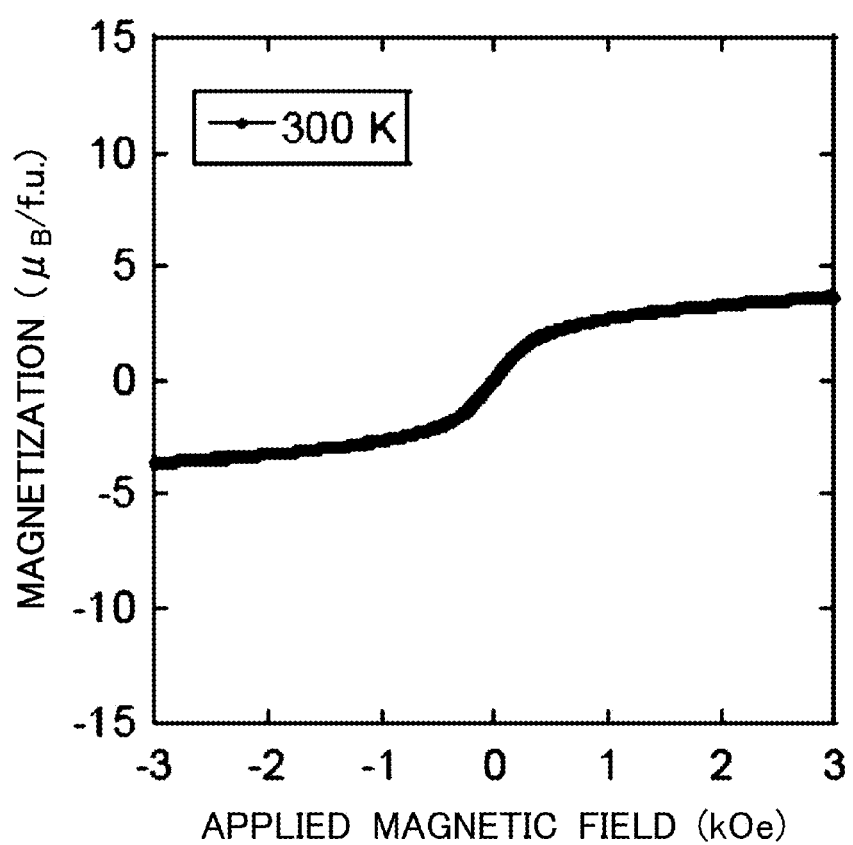
FIG. 5E shows a magnetic field dependency of a magnetization of a $Co_8Zn_8Mn_4$ at 300K.
Figure 5F:
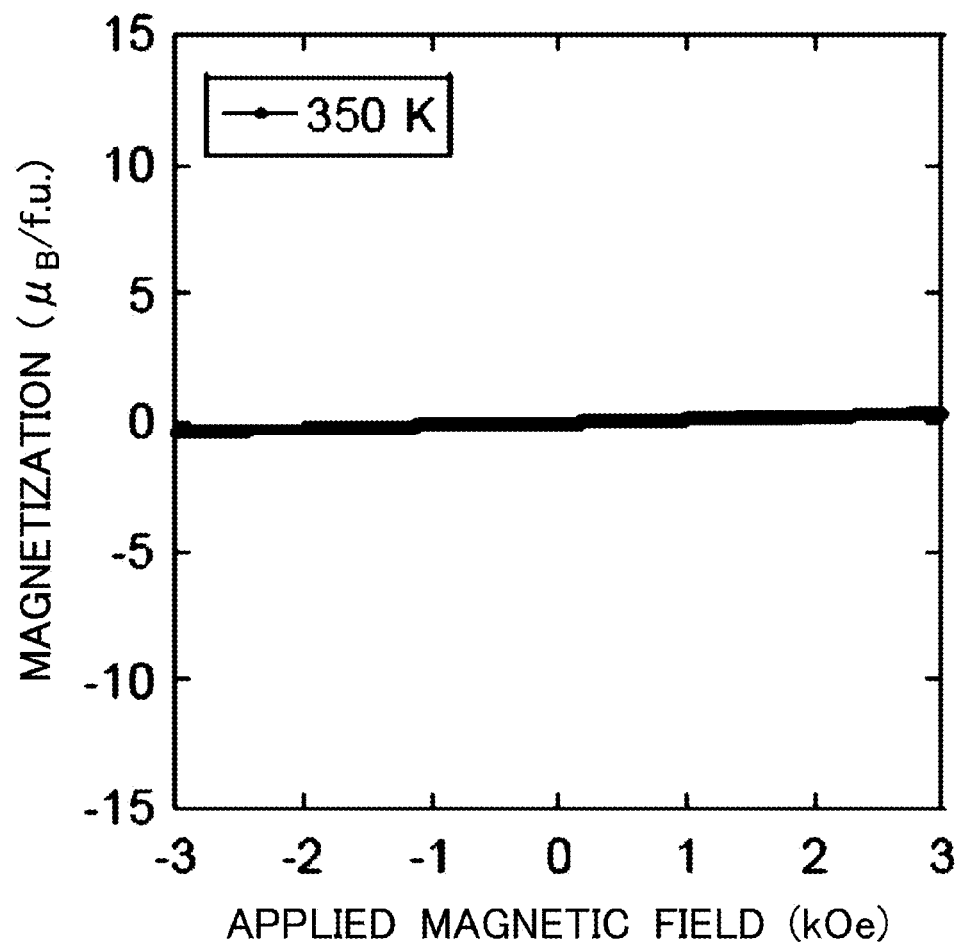
FIG. 5F shows a magnetic field dependency of a magnetization of a $Co_8Zn_8Mn_4$ at 350K.

FIG. 4 shows a temperature dependency of a magnetization of a $Co_8Zn_8Mn_4$ which is a β-Mn type crystal structure. The horizontal axis shows a temperature (K) of a $Co_8Zn_8Mn_4$, and the vertical axis shows a magnetization ($\mu_B$/f.u.). An applied magnetic field H of the present example is 1 kOe (oersted). The $Co_8Zn_8Mn_4$ is a helical magnet in which a transition temperature of helical magnet is around 310K (37 degrees Celsius). A transition temperature of helical magnet is important in determining a temperature to generate the skyrmion 40. A transition temperature of helical magnet is a temperature to transit to a helical magnetic phase, and shows a maximum temperature which can generate the skyrmion 40.

FIG. 5A to FIG. 5F show magnetic field dependencies of a magnetization of a $Co_8Zn_8Mn_4$. The horizontal axis shows an applied magnetic field H (kOe) which is given to a $Co_8Zn_8Mn_4$ between −3 kOe to 3 kOe, and the vertical axis shows a magnetization ($\mu_B$/f.u.). FIG. 5A to FIG. 5F correspond to cases in which a temperature of the $Co_8Zn_8Mn_4$ is respectively 2K, 50K, 100K, 200K, 300K, and 350K. In the case of 2K, the magnetic field dependency of the magnetization has hysteresis characteristics. In the case in which a temperature which is greater than or equal to 50K is given, the magnetic moment shows soft magnetic properties which has a linearity until around 1 kOe with respect to the applied magnetic field H. These soft magnetic properties are a requirement in order to generate the skyrmion 40. Here, the soft magnetic properties refer to a magnet with a small coercive force. A coercive force is a magnitude of a magnetic field which is needed for overturning the magnetization.

Figure 6:
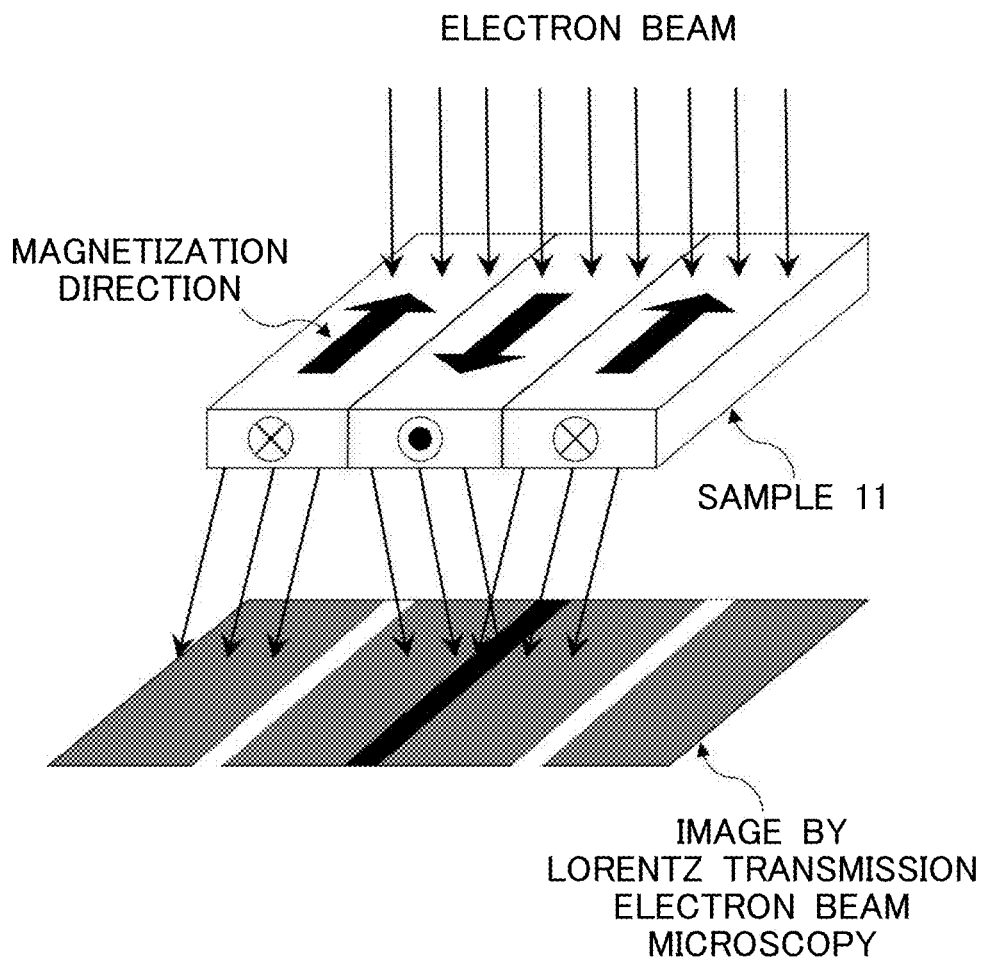
FIG. 6 shows a principle of a method for observing a magnetic moment by the Lorentz electron beam microscopy.

FIG. 6 is a diagram for describing a principle of a method for observing a magnetic moment by a Lorentz electron beam microscopy. A Lorentz electron beam microscopy is a transmission electron beam microscope which observes the magnetic moment utilizing the Lorentz force. Due to the Lorentz force, a magnetic field generated in a sample 11 deflects an incident electron beam. By using a method for analyzing an electron image by the deflected electron beams described below, an intensity and a direction of the magnetic moment can be observed directly. The Lorentz electron beam microscopy is one of the few devices which can observe a nano-scale magnetic moment directly.

The sample 11 is a thin-plate magnet whose thickness is less than or equal to 100 nm. By making the thickness of the sample 11 to be less than or equal to 100 nm, the electron beam accelerated and incident from an upper side of the sample 11 can transmit the sample 11.

Figure 7:
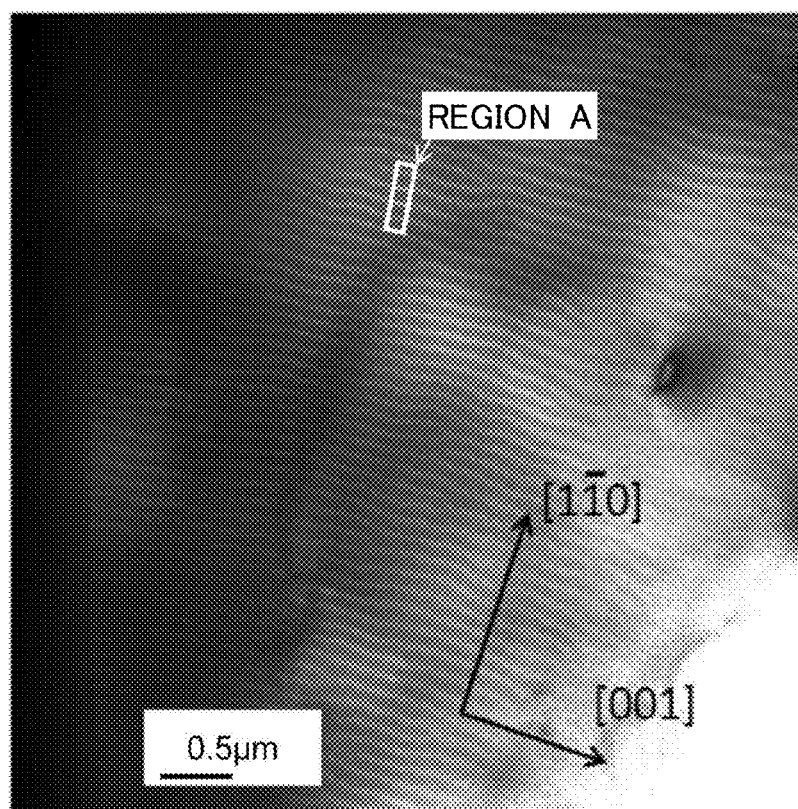
FIG. 7 shows an observed image of a $Co_8Zn_8Mn_4$ by the Lorentz electron beam microscopy.

The Lorentz electron beam microscopy makes the electron beam incident in parallel from the upper side of the sample 11. A magnetization direction of a magnetic domain of the sample 11 is oriented in a plane direction of the sample 11 like the arrows. Thereby, the Lorentz force is generated due to the magnetic field of the magnetic domain, and bends tracks of electron beams. Because an electron beam direction is different depending on a direction of the magnetic domain, a distribution occurs at an electron density which reaches a focus surface. An electron density distribution consists of a black portion with a high density and a white portion with a low density, and the respective portion shows a domain boundary. In the domain boundary, overturning of black and white is generated in an alternating way, and respective gaps of the black and white overturning show domains. Thereby, the magnetic domain can be observed. In this manner, the Lorentz electron beam microscopy can directly observe an image which is generated by projecting the magnetic moment to a two-dimensional plane. If the magnetic moment is a helical structure, the overturning of black and white can be observed continuously. On the other hand, in a normal transmission electron beam microscope, an incident electron beam uses a focused beam which has focal points at the sample plane. By sweeping this converging point on a two-dimensional surface of the sample plane, an atom image of the two-dimensional surface can be obtained. However, electron scattering by the magnetic moment does not receive interference effect, the magnetic moment cannot be observed. Next, a chiral magnet actually observed by the Lorentz electron beam microscopy is shown. FIG. 7 shows an image by Lorentz electron beam microscopy of a $Co_8Zn_8Mn_4$ at temperature 95K, and in which an applied magnetic field H is B=0. A thickness of the sample 11 of the present example is 50 nm. In a [1-10] direction, light and shade of a striped pattern along a [011] direction can be observed. This striped pattern shows that the magnetic moment is helically rotated. An actually measured distance from a white region to a white region shows a helical pitch. A region A is any region along the [1-10] direction.

Figure 8:
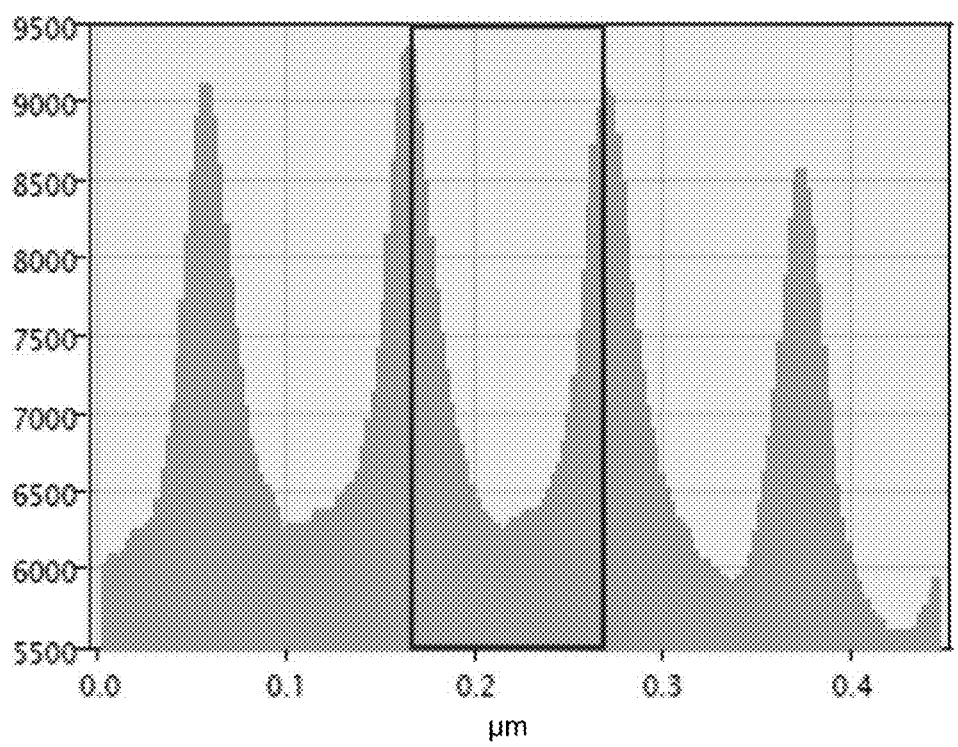
FIG. 8 shows a helical pitch of a $Co_8Zn_8Mn_4$ by the Lorentz electron beam microscopy.

FIG. 8 shows a measurement result of an intensity along the [1-10] direction of the region A in FIG. 7. The horizontal axis shows a location along the [1-10] direction inside the region A, and the vertical axis shows an intensity of observed signals. In the region A, the intensity is distributed continuously, and a peak is at equal intervals. A peak-to-peak distance is equivalent to a helical pitch. Because the peak-to-peak distance of the present example is 100 nm, the helical pitch is 100 nm.

Figure 9:
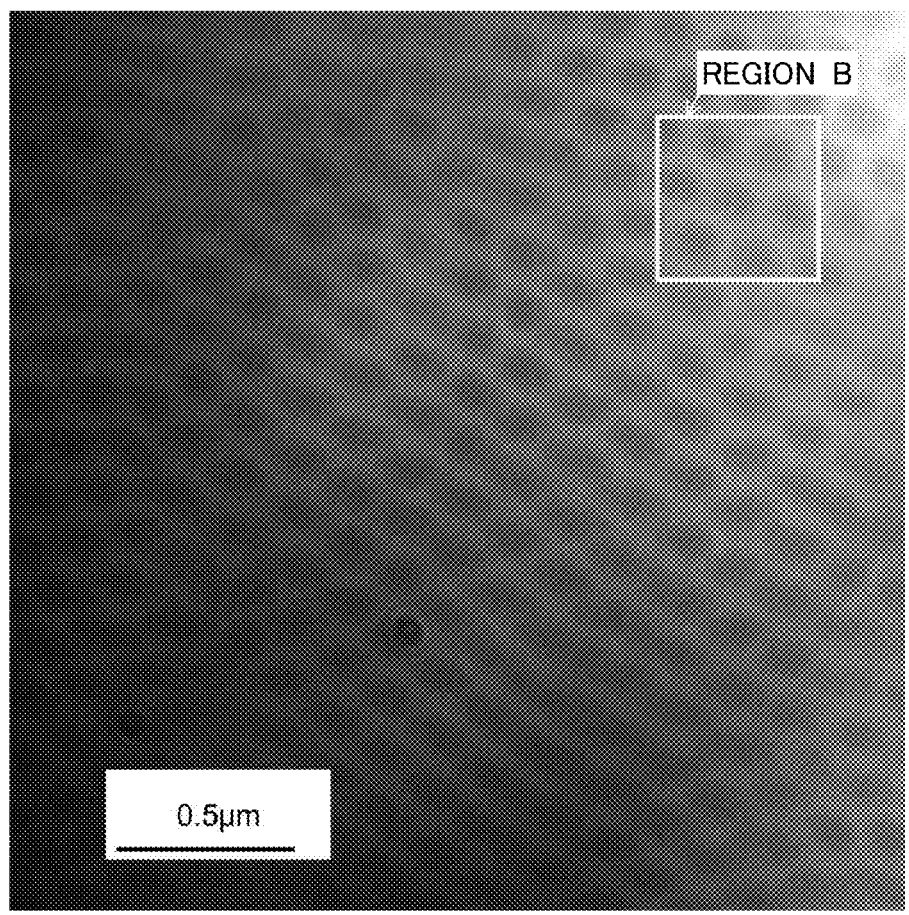
FIG. 9 shows an observed image of a $Co_8Zn_8Mn_4$ in the case of a magnetic field 450 Oe by the Lorentz electron beam microscopy.

FIG. 9 shows an image by Lorentz electron beam microscopy of a $Co_8Zn_8Mn_4$ at temperature 293K (20 degrees Celsius), and in which an applied magnetic field H is B=45 mT (450 Oe). The image by Lorentz electron beam microscopy of the present example shows the state in which the skyrmion 40 is generated, and black dots occur. In the case in which the applied magnetic field H shown in FIG. 7 is B=0 mT (0 Oe), a dotted image like this cannot be observed. A black dot shows a hexagonal close-packed crystal structure which has a six rotational symmetry so as to have a close-packed structure. A lattice constant of skyrmion crystal calculated by the image by Lorentz electron beam microscopy of the present example matches the numerical value 120 nm, which is determined by helical pitch 100 nm of a helical magnetic phase with zero magnetic field. From the above, it is found that black dots of the present example are crystal lattices made of the skyrmion 40. A diameter of the skyrmion 40 is 120 nm.

Figure 10:
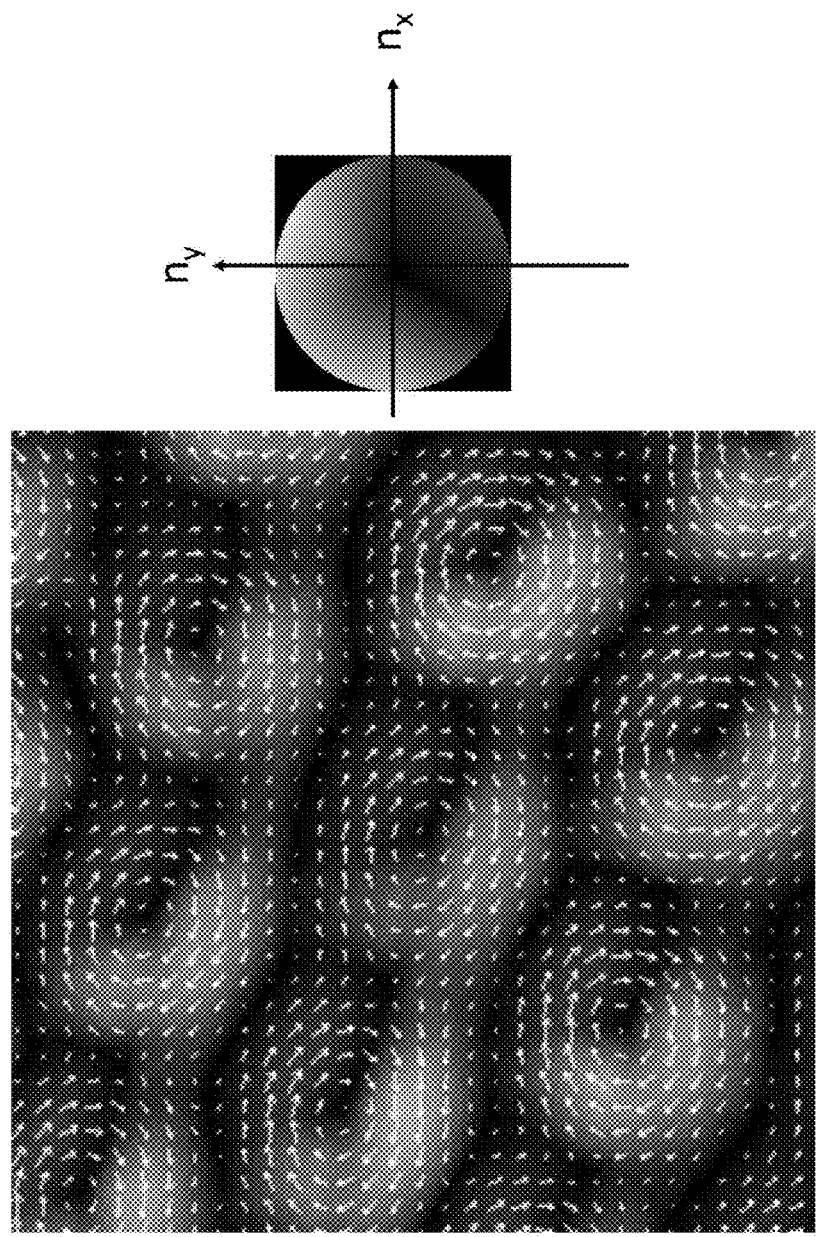
FIG. 10 shows a magnetic moment analysis result of an observed image of a $Co_8Zn_8Mn_4$ by the Lorentz electron beam microscopy.

FIG. 10 shows a magnetic distribution of the region B (FIG. 9) which is obtained by analyzing the image by Lorentz electron beam microscopy in FIG. 9 using the intensity transport equation method. An arrow which shows the magnetic moment on a sample 11 rotates clockwise. A length of the arrow corresponds to a projective component to the sheet of paper of a magnitude of the magnetic moment. It is shown that the length of the arrow becomes shorter from a circumferential portion to a center portion, and the center portion is oriented toward a rear surface direction from a front surface being perpendicular to the sheet of paper. The sample 11 of the present example generates the magnetic moment in the state of the skyrmion (c) in FIG. 2. Vortex structures of the skyrmion 40 of the present example are all in the same direction. A magnetic distribution is calculated depending on an analysis of the image by Lorentz electron beam microscopy by the intensity transport equation method. Thereby, details of a structure of the magnetic moment of the skyrmion 40 become apparent. That is, the image by Lorentz electron beam microscopy ensures that the skyrmion 40 is generated in the sample 11.

A magnetic moment of the skyrmion 40 can be calculated by using the intensity transport equation method. In the present example, the image by Lorentz electron beam microscopy in the region B is analyzed and the magnetic distribution of the magnetic moment is calculated by the transport-of-intensity equation. The magnetic distribution of the magnetic moment can be calculated by the following principle. The magnetic distribution in the magnet changes a phase of an electron through Aharonov-Bohm effect. The magnetic distribution can be calculated from this phase change. A phase difference in two paths is $$\Delta \phi = -\frac{e}{\hbar} \int B \cdot dS \qquad \text{[Equation 3]}$$

The transport-of-intensity equation calculated by Schroedinger equation by paraxial approximation is shown as follows.

$$\nabla_\perp \cdot (I \nabla_\perp \phi) = -\frac{2\pi}{\lambda} \frac{\partial I}{\partial z} \qquad \text{[Equation 4]}$$

Here, an Z-axis direction is an electron beam incident direction.

$$\nabla_\perp \qquad \text{[Equation 5]}$$

is an operator on a plane which is perpendicular to the z-axis. From this relationship, a phase φ can be calculated by a rate of change of an electron beam intensity I in the Z-axis direction, $$\partial I / \partial z \qquad \text{[Equation 6]}$$

Based on a relative equation of the phase φ and the electron beam intensity I (the transport-of-intensity equation), a magnetic distribution is obtained by electron beam intensity measurement.

Figure 11:
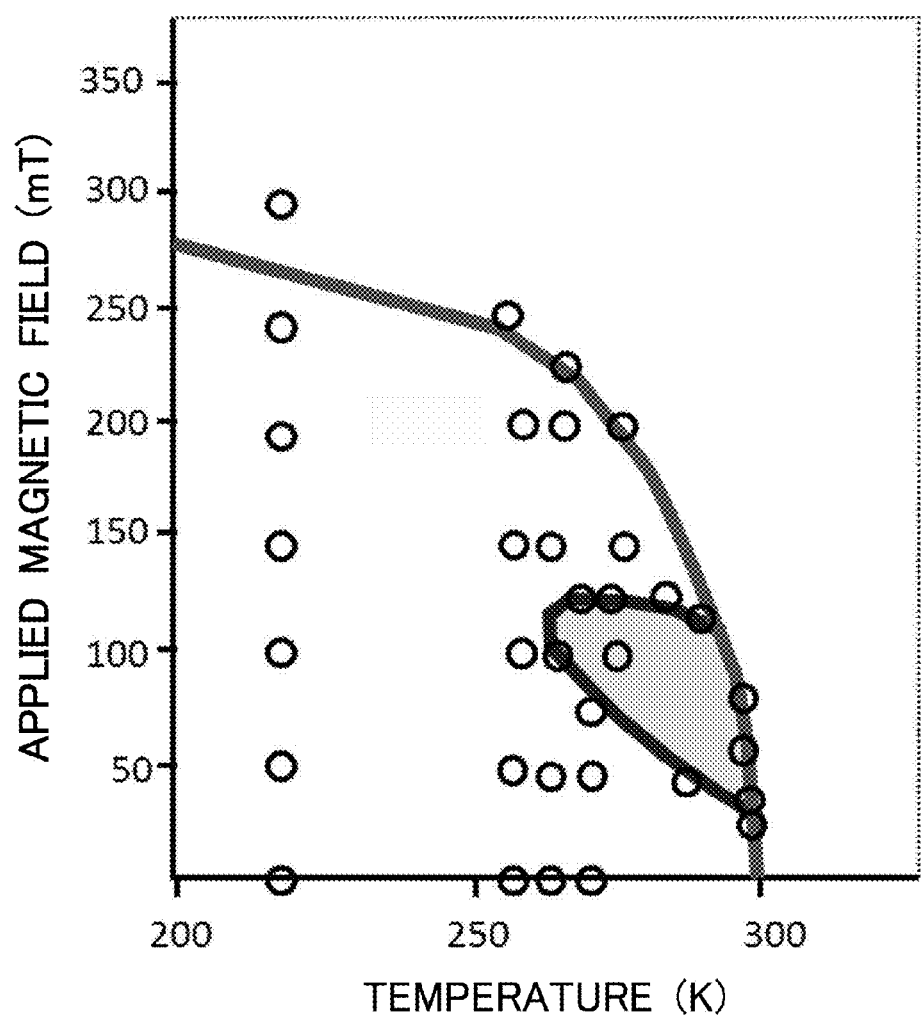
FIG. 11 shows a magnetic phase diagram of a skyrmion of a $Co_8Zn_8Mn_4$.

FIG. 11 shows a skyrmion phase diagram determined by the image by Lorentz electron beam microscopy of a $Co_8Zn_8Mn_4$. A thickness of the sample 11 is 50 nm. The thickness of the sample 11 is important in generating the skyrmion 40. It is observed in details in the example of the FeGe that the thinner the sample 11 is, the wider the SkX region which shows the crystal phase of skyrmion is (Non-Patent Document 1). The crystal phase of skyrmion (SkX) is present at a range from 260K to 300K, the applied magnetic field H is present at a region from 30 mT to 130 mT.

Implementation Example 2

Next, an implementation example about a $Co_8Zn_{10}Mn_2$ which is a magnet which has the β-Mn type crystal structure, and is $Co_xZn_yMn_z$, where x+y+z=20, 0≤x, y, z≤20 is described.

Figure 12:
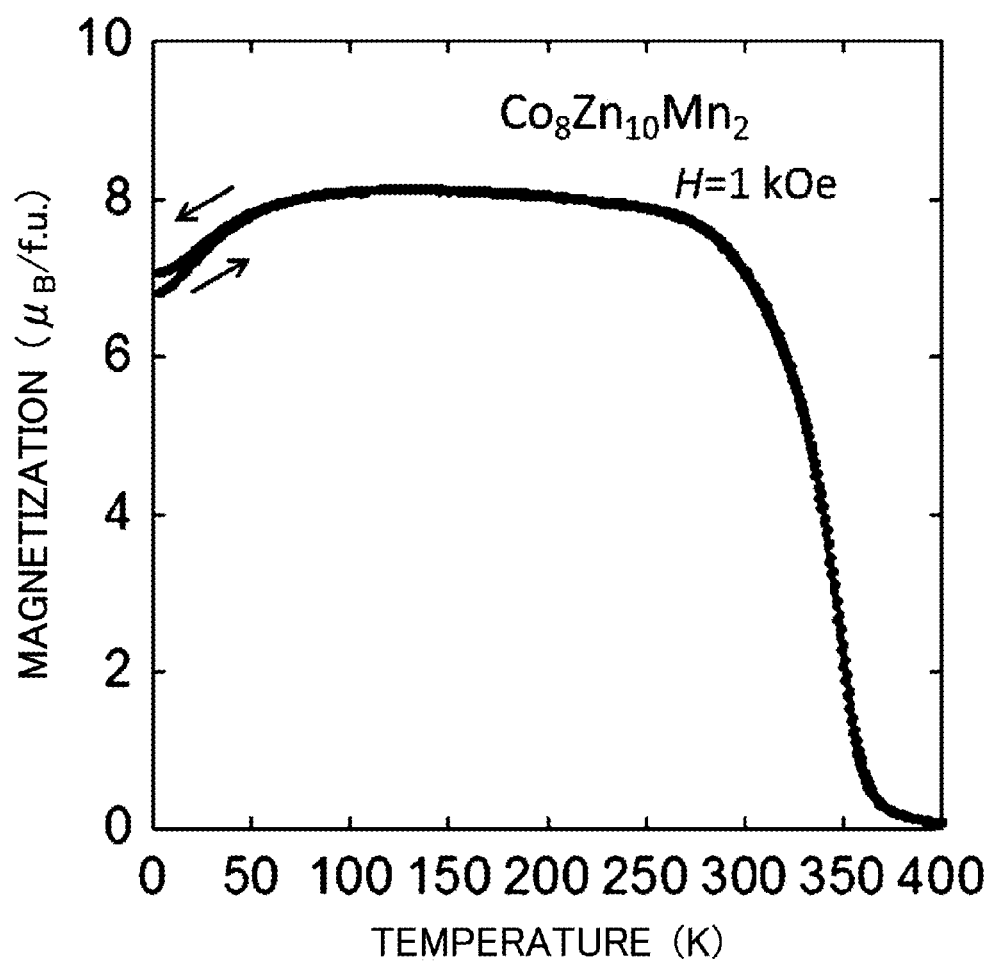
FIG. 12 shows a temperature dependency of a magnetization of a $Co_8Zn_{10}Mn_2$.

FIG. 12 shows a temperature dependency of a magnetization of a $Co_8Zn_{10}Mn_2$. The horizontal axis shows a temperature (K) of the $Co_8Zn_{10}Mn_2$, and the vertical axis shows a magnetization ($\mu_B$/f.u.). An applied magnetic field H of the present example is 1 kOe. The magnetization of the $Co_8Zn_{10}Mn_2$ rapidly decreases at around 350K (77 degrees Celsius). The $Co_8Zn_{10}Mn_2$ is a helical magnet in which a transition temperature of helical magnet is around 350K (77 degrees Celsius). Also, a magnetic field dependency of a magnetization is very similar to FIG. 5A to FIG. 5F. The magnetic moment which is greater than or equal to 50K shows soft magnetic properties which has a linearity until around 1 kOe with respect to the applied magnetic field H. These soft magnetic properties satisfy a requirement in order to generate the skyrmion 40.

Figure 13A:
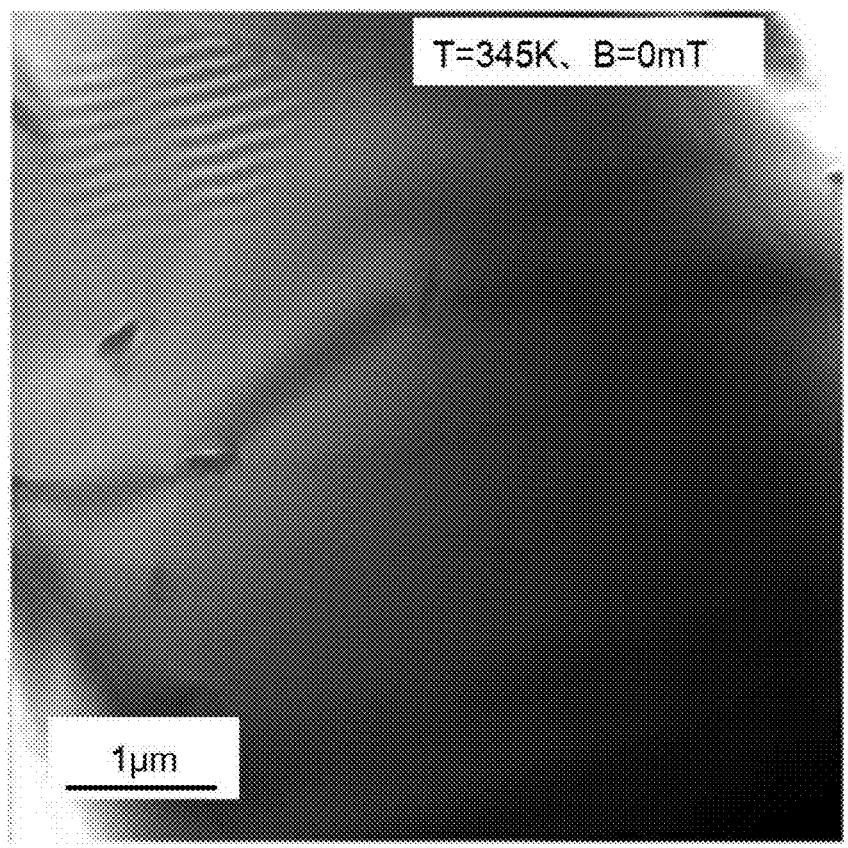
FIG. 13A shows an observed image of a $Co_8Zn_{10}Mn_2$ in the case of 345K, applied magnetic field intensity is zero by the Lorentz electron beam microscopy.
Figure 13B:
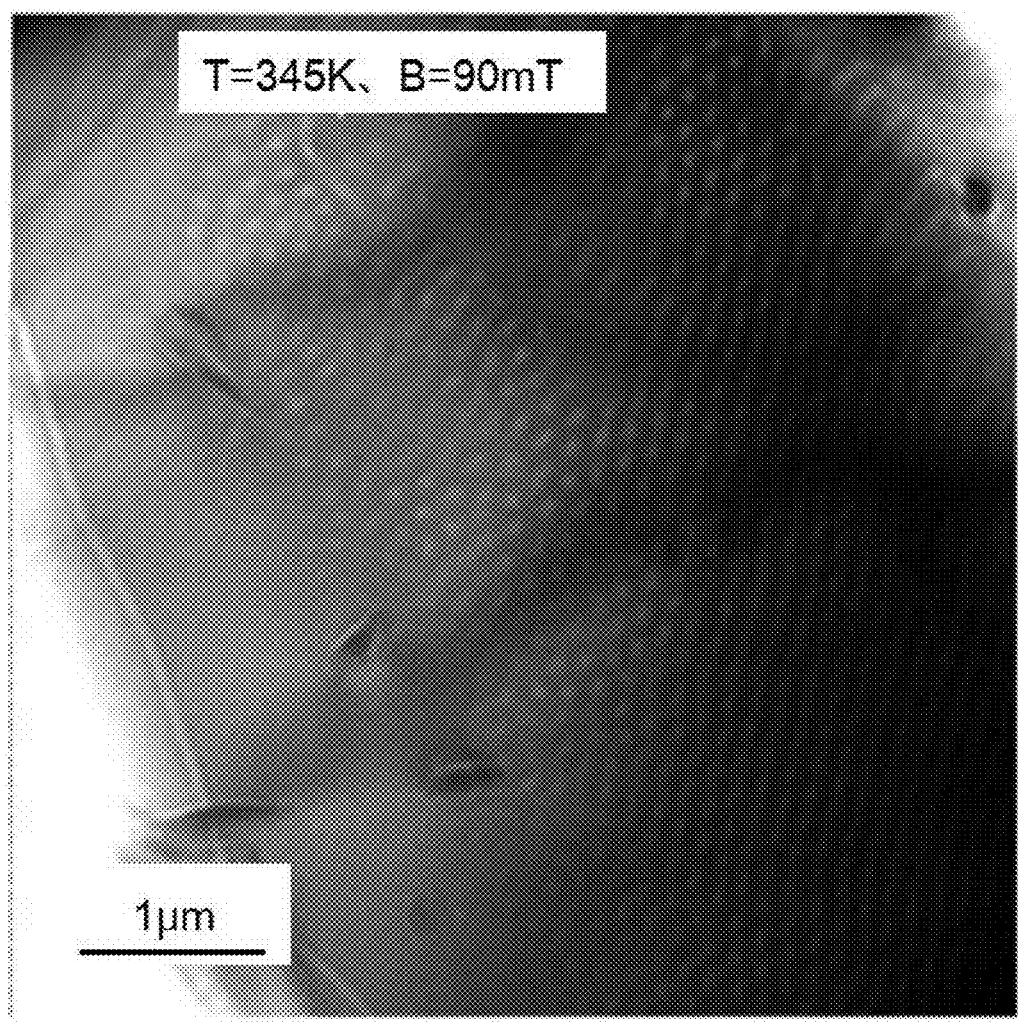
FIG. 13B shows an observed image of a $Co_8Zn_{10}Mn_2$ in the case of 345K, applied magnetic field intensity is 90 mT by the Lorentz electron beam microscopy.

FIG. 13A and FIG. 13B show images by Lorentz electron beam microscopy of a $Co_8Zn_{10}Mn_2$. FIG. 13A shows an image by Lorentz electron beam microscopy of the $Co_8Zn_{10}Mn_2$ at temperature 345K, in which an applied magnetic field H is B=0 mT. At the image by Lorentz electron beam microscopy in which the applied magnetic field H is B=0 mT, the skyrmion crystal lattice is not generated.

FIG. 13B shows an image by Lorentz electron beam microscopy of the $Co_8Zn_{10}Mn_2$ at temperature 345K, an applied magnetic field H is B=90 mT (900 Oe). In the image by Lorentz electron beam microscopy of the present example, it is found that a skyrmion crystal lattice is generated. A dotted pattern is the skyrmion 40.

Figure 14:
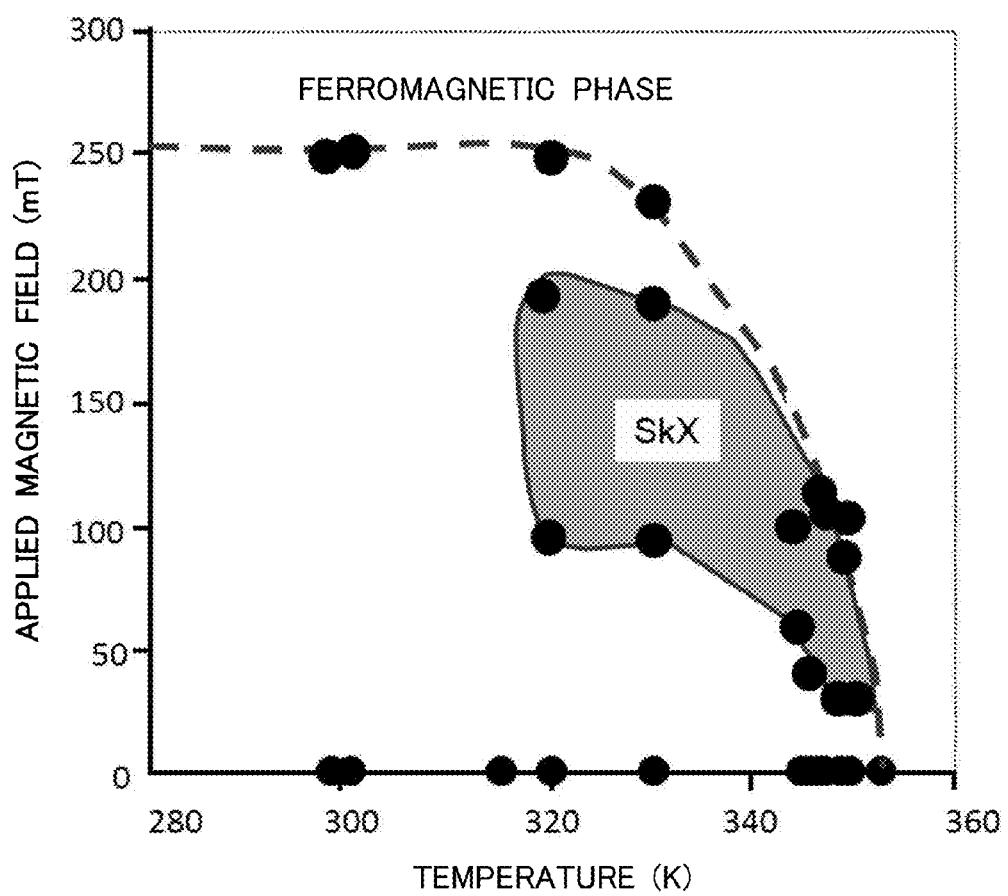
FIG. 14 shows a magnetic phase diagram of a skyrmion of a $Co_8Zn_{10}Mn_2$.

FIG. 14 shows a skyrmion phase diagram determined by the observation by Lorentz electron microscopy of a $Co_8Zn_{10}Mn_2$. In the present example, the sample 11 is in a thin layer shape having a thickness of 50 nm, and a 112-face of the sample 11 is observed. The crystal phase of skyrmion (SkX) is present at a range from temperature 320K to 350K, the applied magnetic field H is present at a region from 30 mT to 200 mT. Compared to the case of the $Co_8Zn_8Mn_4$ shown in FIG. 11, a region of the crystal phase of skyrmion (SkX) is large. Also, compared to the case of the $Co_8Zn_8Mn_4$, in the case of the $Co_8Zn_{10}Mn_2$, the region of the crystal phase of skyrmion (SkX) spreads to a high temperature side.

Implementation Example 3

Next, an implementation example about a $Co_8Zn_9Mn_3$ which is a magnet which has the β-Mn type crystal structure, and is $Co_xZn_yMn_z$, where x+y+z=20, 0≤x, y, z≤20 is described. The $Co_8Zn_9Mn_3$ is a bulk polycrystal.

Figure 15:
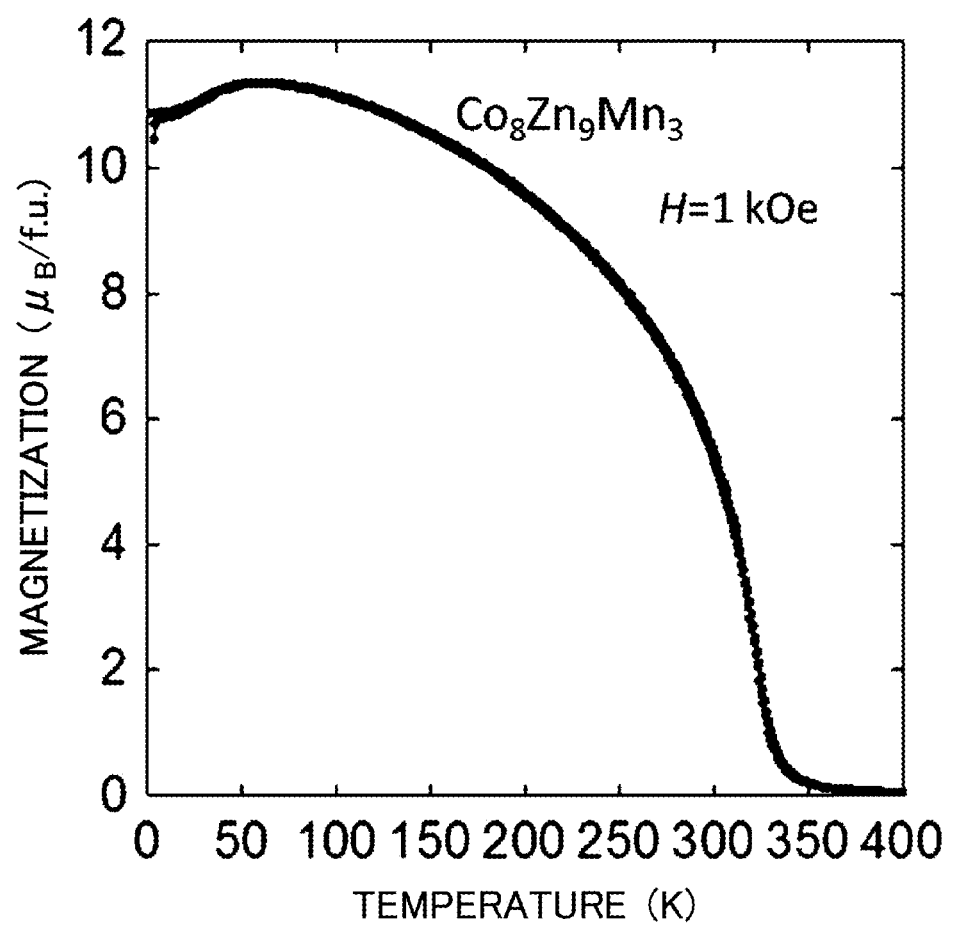
FIG. 15 shows a temperature dependency of a magnetization of a $Co_8Zn_9Mn_3$.

FIG. 15 shows a temperature dependency of a magnetization of a $Co_8Zn_9Mn_3$. The horizontal axis shows a temperature (K) of a $Co_8Zn_9Mn_3$, and the vertical axis shows a magnetization ($\mu_B$/f.u.). An applied magnetic field H of the present example is 1 kOe. The $Co_8Zn_9Mn_3$ is a helical magnet in which a transition temperature of helical magnet is 325K (52 degrees Celsius). Also, a magnetic field dependency of a magnetization ($\mu_B$/f.u.) is very similar to the examples in FIG. 5A to FIG. 5F. The magnetic moment which is greater than or equal to 50K shows soft magnetic properties which has a linearity until around 1 kOe with respect to the applied magnetic field H. These soft magnetic properties satisfy a requirement in order to generate the skyrmion 40.

Figure 16:
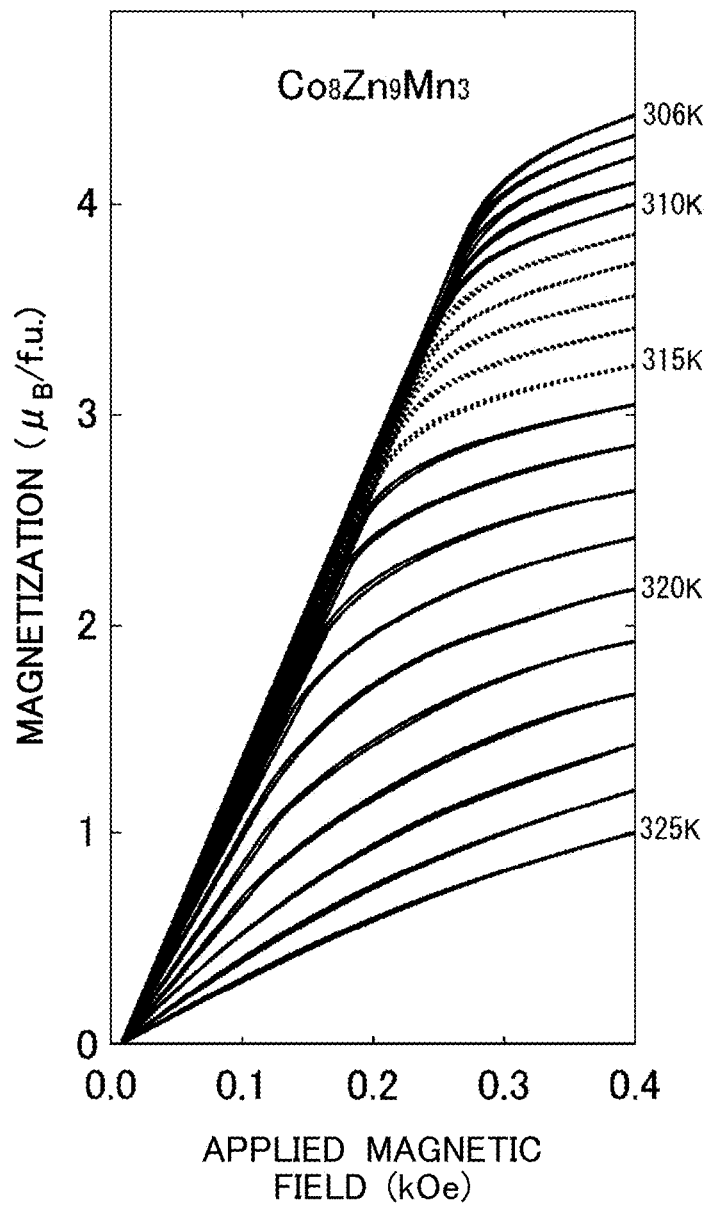
FIG. 16 shows a magnetic field dependency of a magnetization of a $Co_8Zn_9Mn_3$.

FIG. 16 shows a magnetic field dependency of a magnetization of a $Co_8Zn_9Mn_3$. In the present example, a magnetic field dependency of the magnetization at around 300K (306K to 325K) is shown. The horizontal axis shows an applied magnetic field H (kOe), and the vertical axis shows a magnetization ($\mu_B$/f.u.). Each curve corresponds to each of the magnetic field dependency of the magnetization in the cases when a temperature is changed by 1K at a temperature range of 306K to 325K. With an increase of an applied magnetic field H, the $Co_8Zn_9Mn_3$ tends to have a bigger magnetization. Also, the $Co_8Zn_9Mn_3$ has a bigger magnetization intensity with decrease in a temperature at around 300K. The magnetization of the $Co_8Zn_9Mn_3$ has a linearity until around 1 kOe with respect to the magnetic field, and shows soft magnetic properties.

Figure 17:
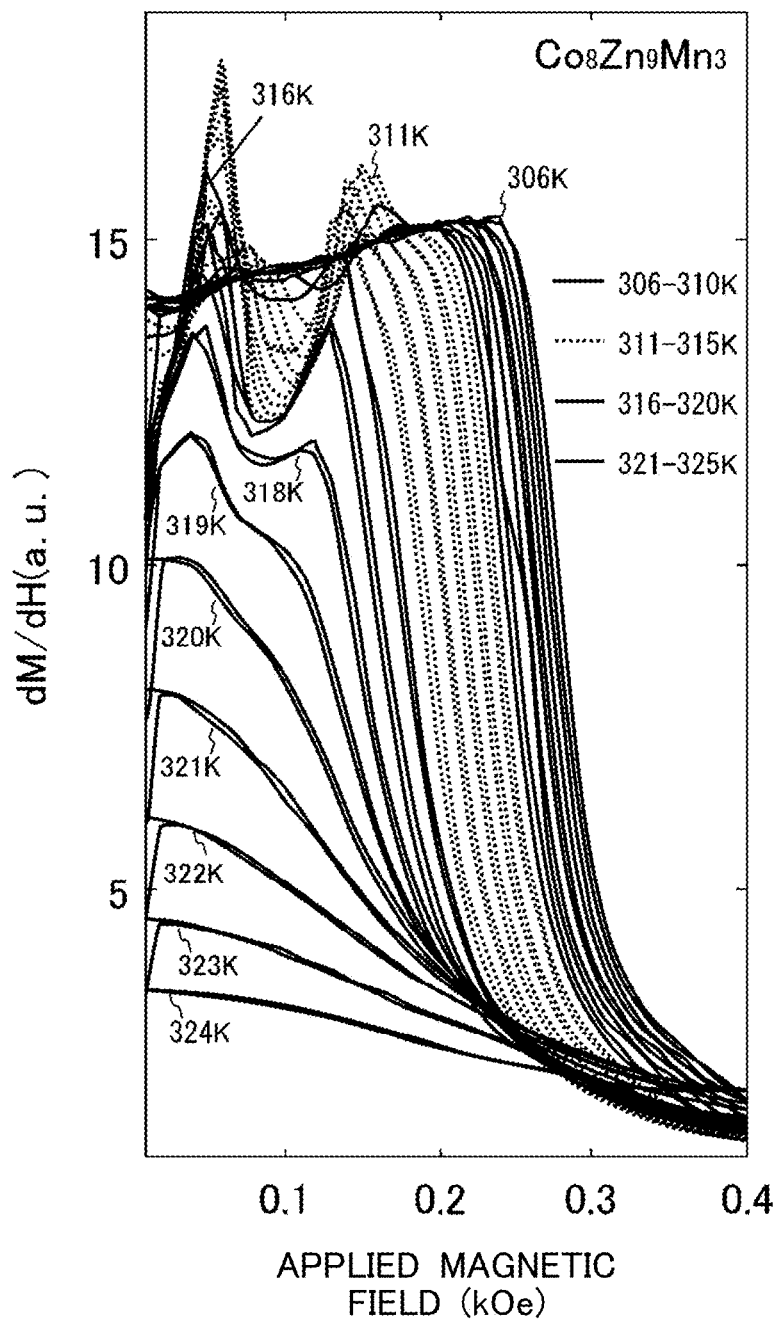
FIG. 17 shows a differential data of a magnetic field dependency of a magnetization of a $Co_8Zn_9Mn_3$.

FIG. 17 shows a curve obtained by differentiating a magnetic field dependency of a magnetization of a $Co_8Zn_9Mn_3$. The horizontal axis shows an applied magnetic field H (kOe), and the vertical axis shows a value dM/dH (a.u.) obtained by differentiating a magnetization M with an applied magnetic field H. Four temperature regions have tendencies of respective different differential curves. For example, at a range from 311K to 319K, the applied magnetic field H has a dip structure at a differential value dM/dH at a region from 0.05 kOe to 0.13 kOe. The dip structure of the differential value dM/dH shows that there was a change to the magnetic distribution of the $Co_8Zn_9Mn_3$ due to the generation of the skyrmion 40.

Figure 18:
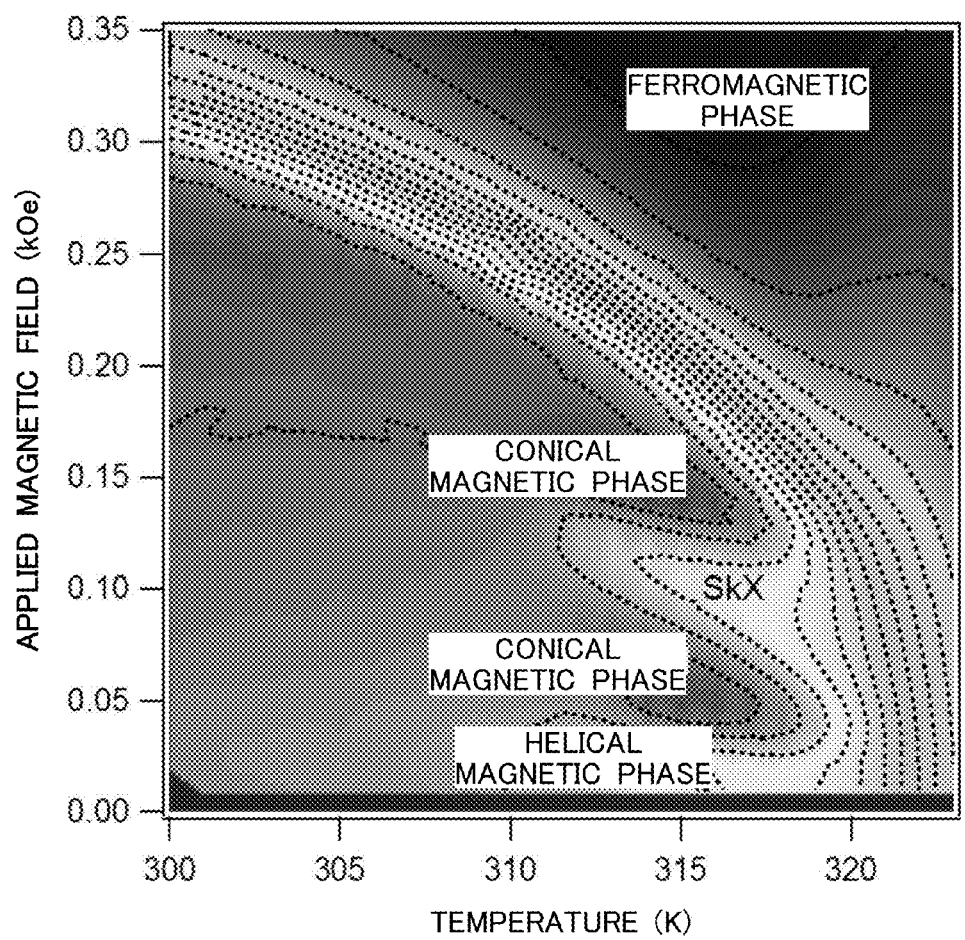
FIG. 18 shows a magnetic phase diagram of a skyrmion of a $Co_8Zn_9Mn_3$.

FIG. 18 shows a phase diagram of a crystal phase of skyrmion (SkX) of a $Co_8Zn_9Mn_3$. The phase diagram of a crystal phase of skyrmion (SkX) of the present example is calculated from a differential data of the magnetization shown in FIG. 17. At a range from 311K to 319K, a crystal phase of skyrmion (SkX) occurs at a region from external magnetic field 0.05 kOe to 0.13 kOe. The sample 11 used in the present example is a bulk crystal, not a thin-plate. Because a three-dimensional crystal shape is used, the skyrmion 40 is hardly generated than the case in which a thin-plate is used, and a region of the crystal phase of skyrmion (SkX) is small.

Implementation Example 4

Next, an implementation example of a magnet which has the β-Mn type crystal structure, and is $Co_xZn_yMn_z$, where x+y+z=20, 0≤y, z≤20 is described. In the present example, a $Co_{10}Zn_{10}$ is described in the case x=y=10, z=0. The $Co_{10}Zn_{10}$ is a bulk polycrystal.

Figure 19:
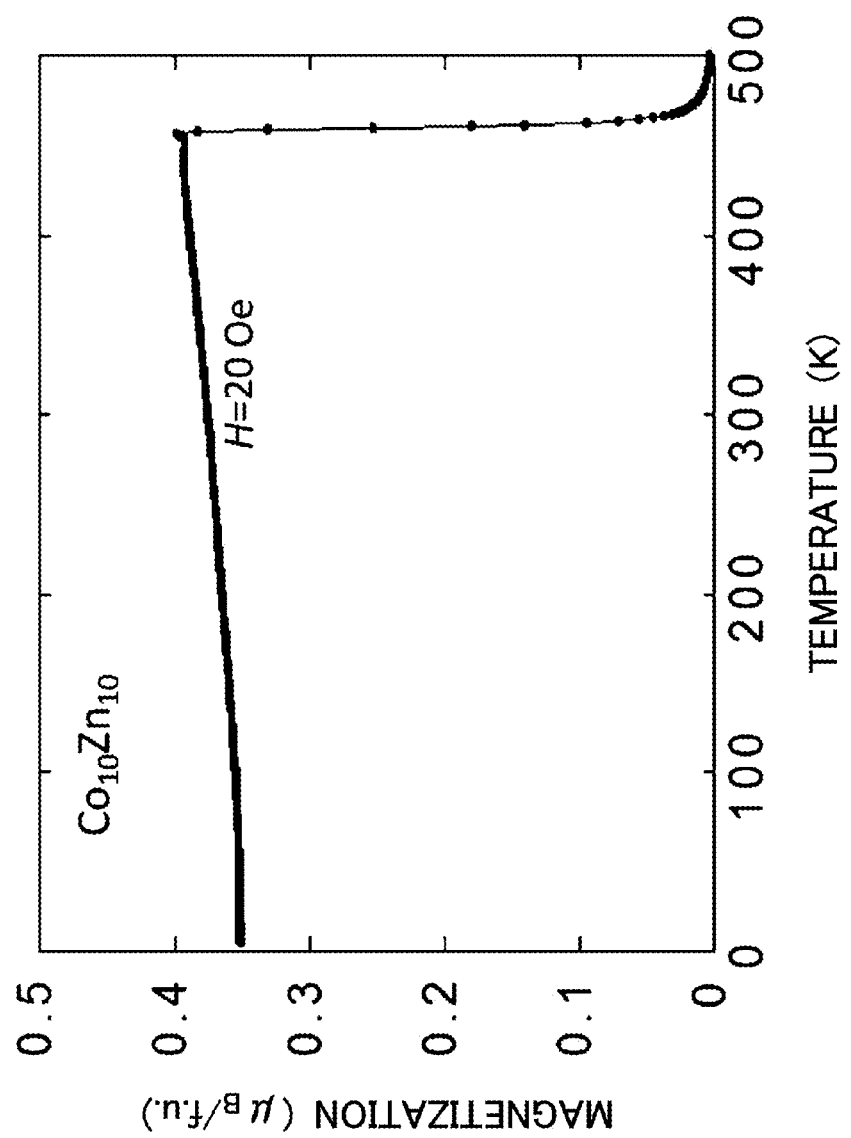
FIG. 19 shows a temperature dependency of a magnetization of a $Co_{10}Zn_{10}$.

FIG. 19 shows a temperature dependency of a magnetization of a $Co_{10}Zn_{10}$. The horizontal axis shows a temperature (K) of a $Co_{10}Zn_{10}$, and the vertical axis shows a magnetization ($\mu_B$/f.u.). An applied magnetic field H of the present example is 20 Oe. The $Co_{10}Zn_{10}$ is a helical magnet in which a transition temperature of helical magnet is 460K (187 degrees Celsius). Also, a magnetic field dependency of a magnetization ($\mu_B$/f.u.) is very similar to example of FIG. 5A to FIG. 5F. The magnetic moment which is greater than or equal to 50K shows soft magnetic properties which has a linearity until around 1 kOe with respect to the applied magnetic field H. These soft magnetic properties satisfy a requirement in order to generate the skyrmion 40.

Figure 20:
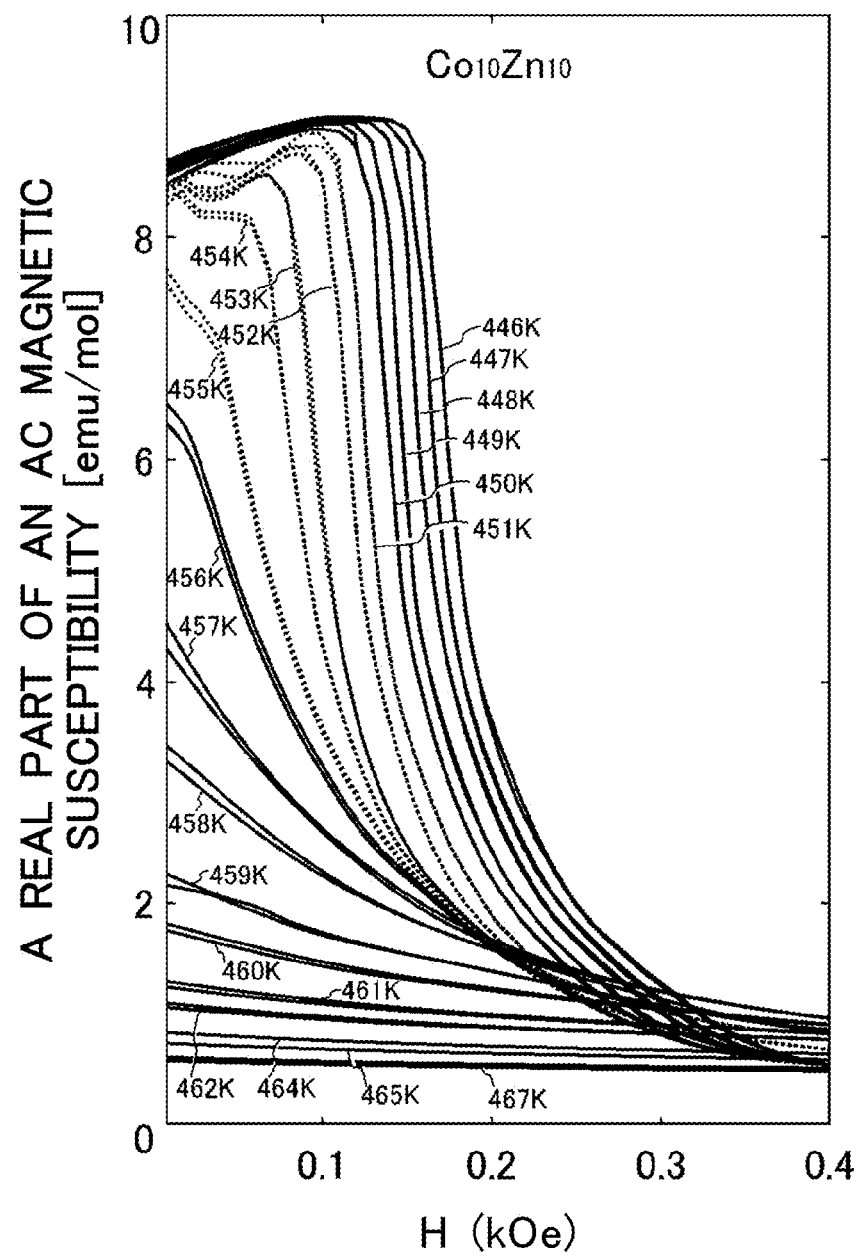
FIG. 20 shows a magnetic field dependency of a real part of an ac magnetic susceptibility of a $Co_{10}Zn_{10}$.

FIG. 20 shows a temperature dependency of a real part of an ac magnetic susceptibility [emu/mol] of a $Co_{10}Zn_{10}$. It is an amount which corresponds to a differential amount of the magnetic moment shown in FIG. 17. In the present example, a magnetic field dependency of a real part of an ac magnetic susceptibility at 446K to 467K is shown. At a temperature range from 451K to 455K, curves which have recesses at a range of an applied magnetic field from 0 to 0.1 kOe are shown. The skyrmion 40 is present in this region. This is the same as that curve portions which have recesses on differential curves of the magnetic moment in FIG. 17 show the region where the skyrmion 40 is present.

Like the above-mentioned, as shown in implementation examples 1 to 4, a material which has a β-Mn type crystal structure has a crystal phase of skyrmion. In addition, a material group with a transition temperature of helical magnet which is above zero temperature is present. As one example of that, by satisfying the conditions of $Co_xZn_yMn_z$, x+y+z=20, 0≤x, y, z≤20, the crystal phase of skyrmion is present above zero temperature. Because a material which has a β-Mn type crystal structure belongs to a $P4_132$ space group which is different from the known B20 type crystal structure, a selection range of a material which can generate the skyrmion 40 is widely expanded.

The material which has a β-Mn type crystal structure is a chemical compound including the following multiple elements other than a simple substance $Mn_{20}$. For example, the material which has a β-Mn type crystal structure is a chemical compound which is made of a chemical formula $A_xB_yC_z$ using multiple elements A, B, and C, and satisfies x+y+z=20 and 0≤x, y, z≤20. More specifically, $Cu_{20-x}Si_x$, $Co_{20-x}Mn_x$, $Fe_{20-x}Mn_x$, $Co_xMn_yTi_z(x+y+z=20)$, $Co_{20-x}Zn_x$, $Co_xZn_yMn_z(x+y+z=20)$, $Al_xFe_yMn_z(x+y+z=20)$, $Ge_{20-x}Mn_x$, $Mn_{20-x}Ni_x$, $Ga_{20-x}Mn_x$, $Al_{20-x}Mn_x$, $Fe_{20-x}Re_x$, $Fe_xRe_yMn_z(x+y+z=20)$, $Mn_{20-x}Sn_x$, $Fe_wGe_xN_yV_z(w+x+y+z=20)$, $Ga_{20-x}V_x$, $Au_{20-x}Si_x$, $B_xRe_yW_z(x+y+z=20)$, $Mg_{20-x}Ru_x$, $Au_{20-x}Nb_x$, $Au_xNb_yZn_z(x+y+z=20)$, $Ag_xCu_yY_z(x+y+z=20)$, $Ag_xP_yPd_z(x+y+z=20)$, $Ag_xP_yPt_z(x+y+z=20)$, and $Ag_xPd_yS_z(x+y+z=20)$ have β-Mn type crystal structures. However, 0≤x, y, z≤20.

Also, a mixed crystal between these chemical compounds also has a βMn type crystal structure. For example, a material which has a β-Mn type crystal structure is a mixed crystal which is a mixed crystal $M_{1-d}N_d$ (0≤d≤1) between a material M which is made of a chemical formula $A_{x1}B_{y1}C_{z1}$ using multiple elements A, B, and C, and satisfies $x_1+y_1+z_1=20$ and $0≤x_1, y_1, z_1≤20$, and a material N which is made of a chemical formula $A'_{x2}B'_{y2}C'_{z2}$ using multiple elements A', B', and C', and satisfies $x_2+y_2+z_2=20$ and $0<x_2, y_2, z_2<20$. The material which has a β-Mn type crystal structure used for the present embodiment may select a magnet which includes a magnetic element among these. Furthermore, if a material in which a transition temperature of helical magnet is above 20 degree is selected, the crystal phase of skyrmion is present above zero temperature.

Implementation Example 5

Figure 21:
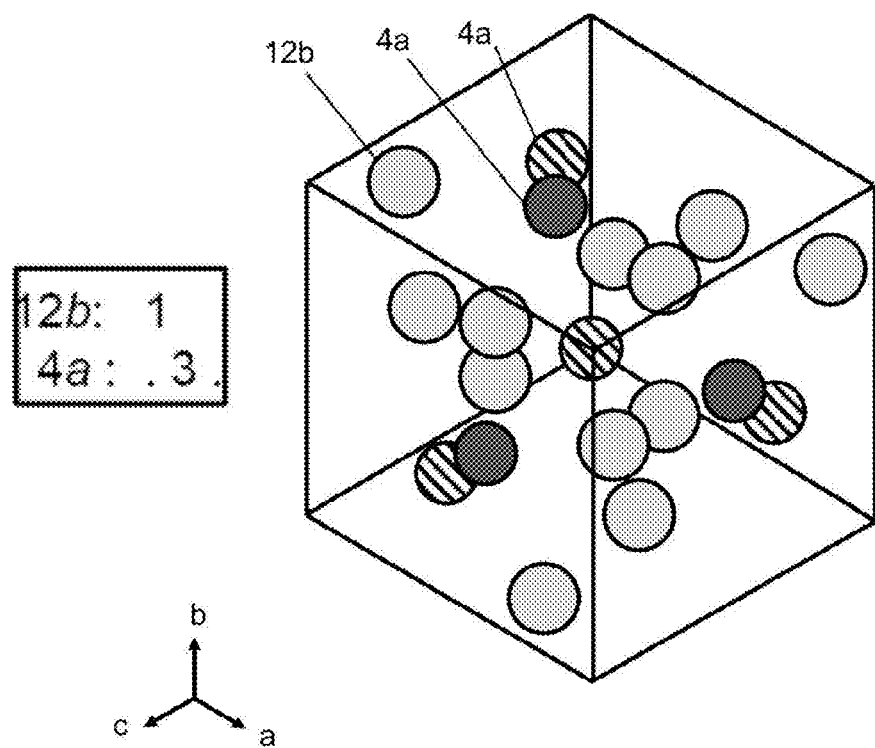
FIG. 21 shows an $Au_4Al$ type crystal structure.

FIG. 21 shows an $Au_4Al$ type crystal structure. The $Au_4Al$ type crystal structure is a crystal structure of $P2_13$ space group which has a chiral structure. The B20 type crystal structure such as FeGe which has a crystal phase of skyrmion is a crystal structure of $P2_13$ space group. A material which has a helical structure $Au_4Al$ type structure has a cubic structure which is made of 20 atoms in a unit cell. Spatial dispositions of 20 elements is made of four equivalent a-sites, four equivalent a'-sites, and twelve equivalent b-sites. A-sites and a'-sites are located on the three-fold rotation axis. B-sites are not on the rotation axis. FIG. 21 shows an $Au_4Al$ type crystal structure seen from the [111] direction of a single a'-site. The structure has a three-fold symmetrical property which 20 elements respectively overlap the original crystal locations after rotating by 120 degrees with respect to the 111-axis. A-sites and a'-sites are located on the three-fold rotation axis. Next, an implementation example of a mixed crystal between a $Fe_5Ni_3Si_2$ and a $Cr_3Ni_5Si_2$ which is an $Au_4Al$ type crystal structure is shown.

Figure 22:
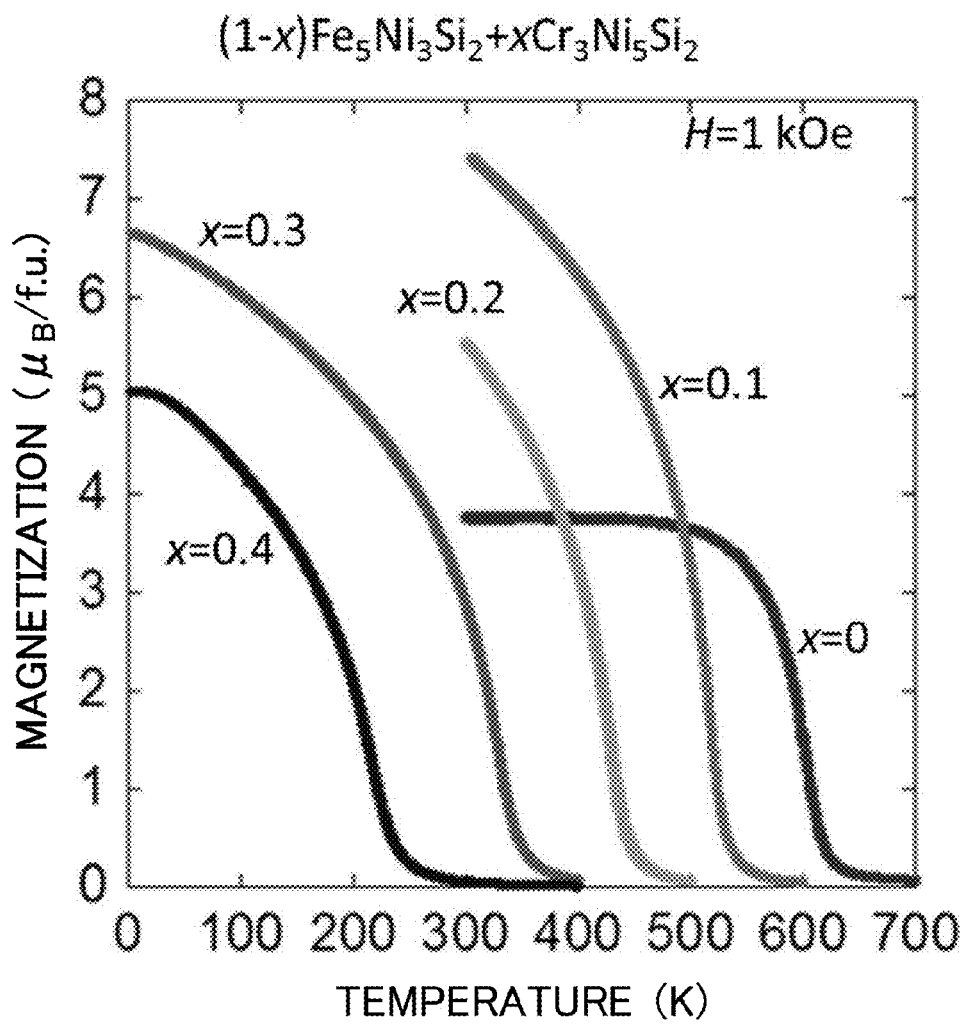
FIG. 22 shows a temperature dependency of a magnetization of a mixed crystal of a $Fe_5Ni_3Si_2$ and a $Cr_3Ni_5Si_2$.
Figure 23A:
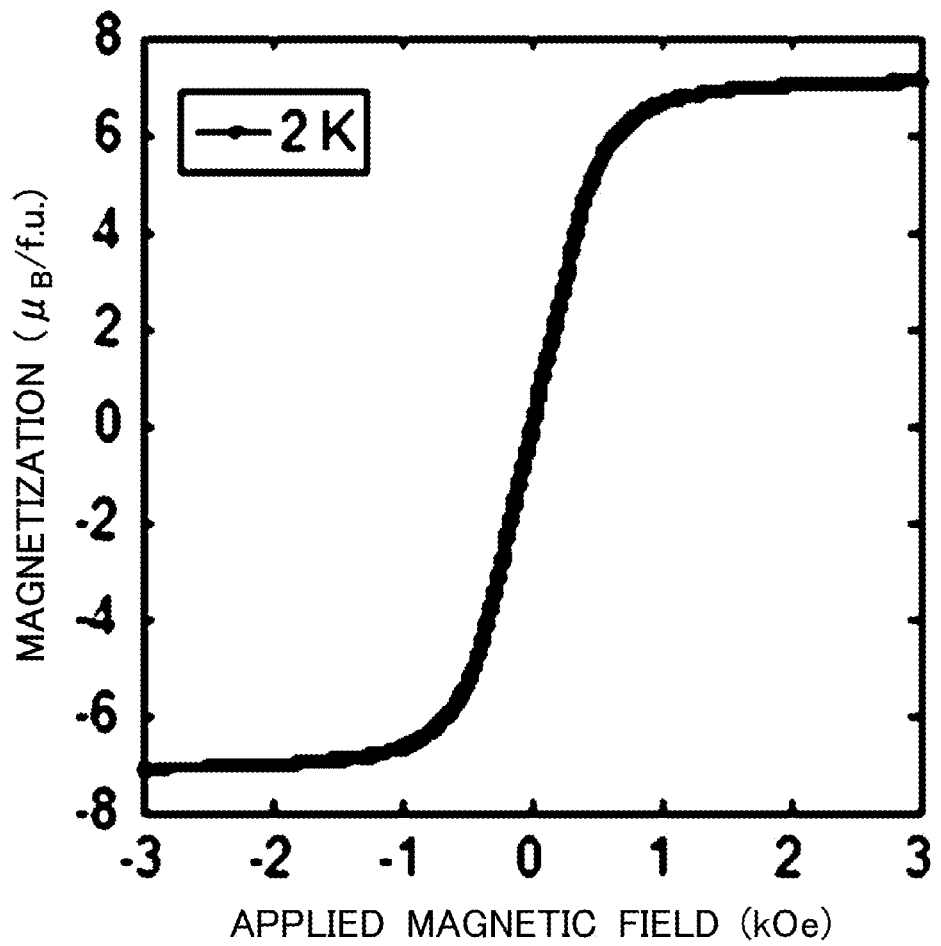
FIG. 23A shows a magnetic field dependency of a magnetization of $0.7Fe_5Ni_3Si_2+0.3Cr_3Ni_5Si_2$ at 2K.
Figure 23B:
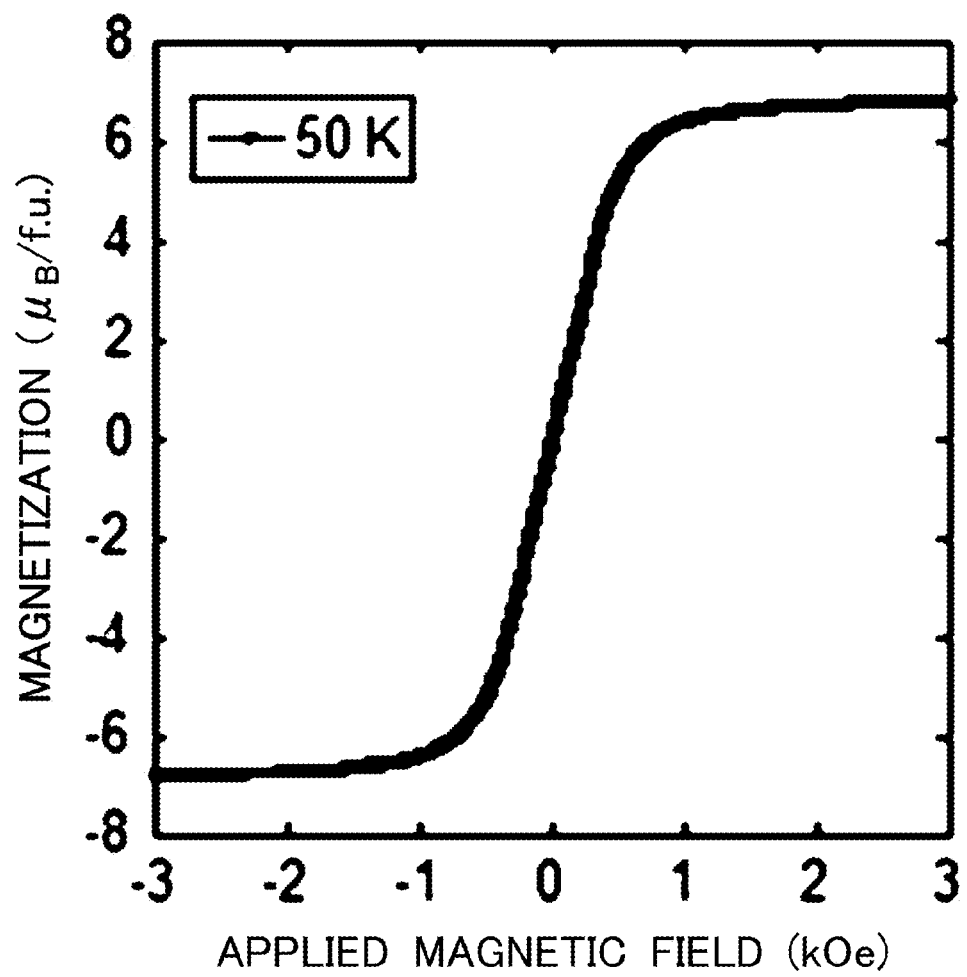
FIG. 23B shows a magnetic field dependency of a magnetization of $0.7Fe_5Ni_3Si_2+0.3Cr_3Ni_5Si_2$ at 50K.
Figure 23C:
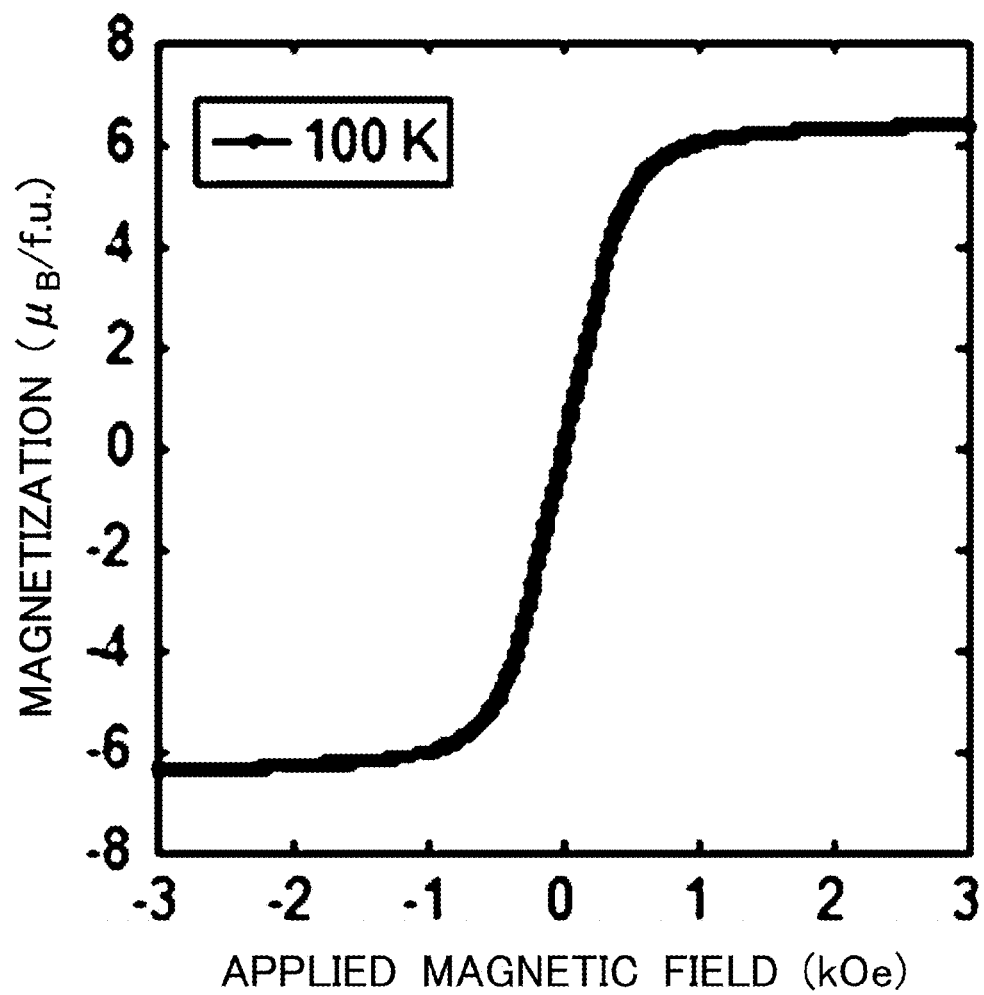
FIG. 23C shows a magnetic field dependency of a magnetization of $0.7Fe_5Ni_3Si_2+0.3Cr_3Ni_5Si_2$ at 100K.
Figure 23D:
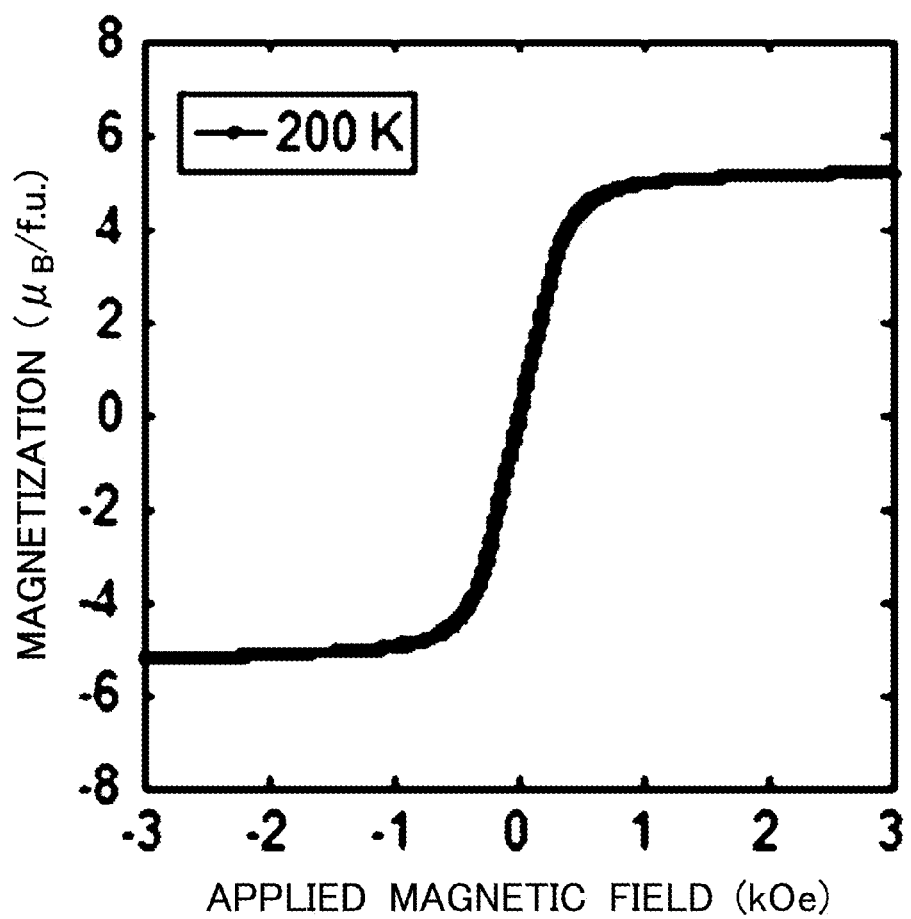
FIG. 23D shows a magnetic field dependency of a magnetization of $0.7Fe_5Ni_3Si_2+0.3Cr_3Ni_5Si_2$ at 200K.
Figure 23E:
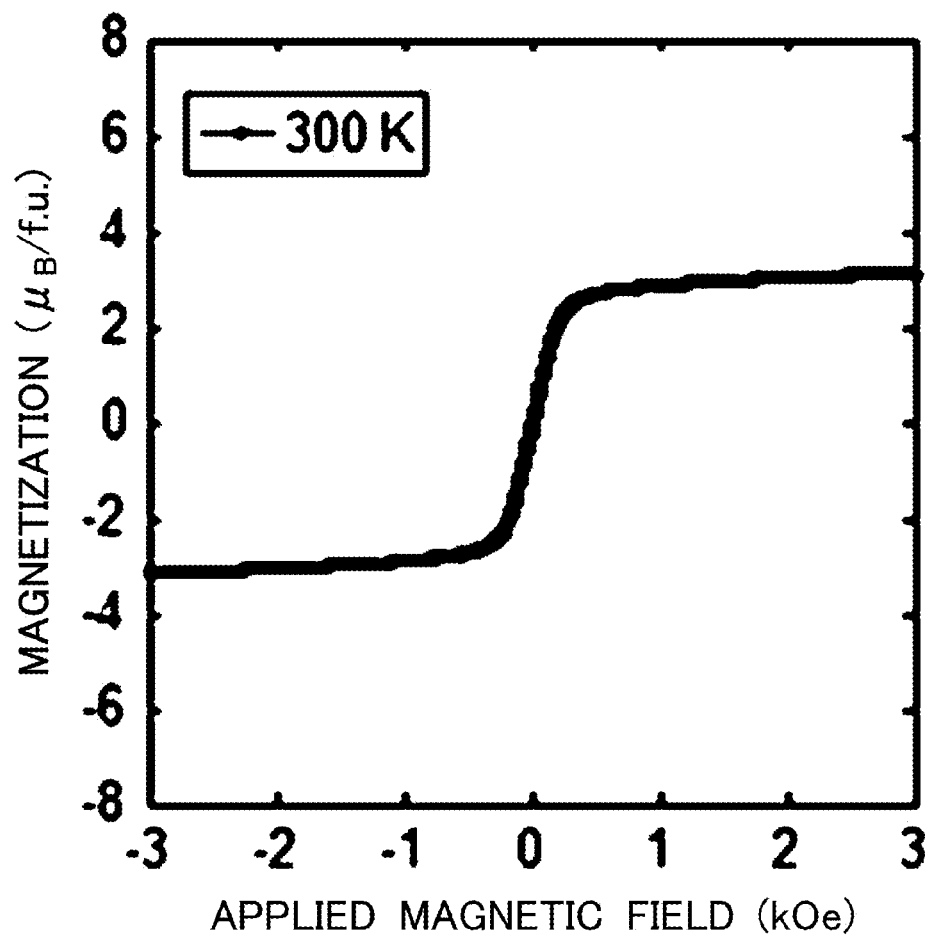
FIG. 23E shows a magnetic field dependency of a magnetization of $0.7Fe_5Ni_3Si_2+0.3Cr_3Ni_5Si_2$ at 300K.
Figure 23F:
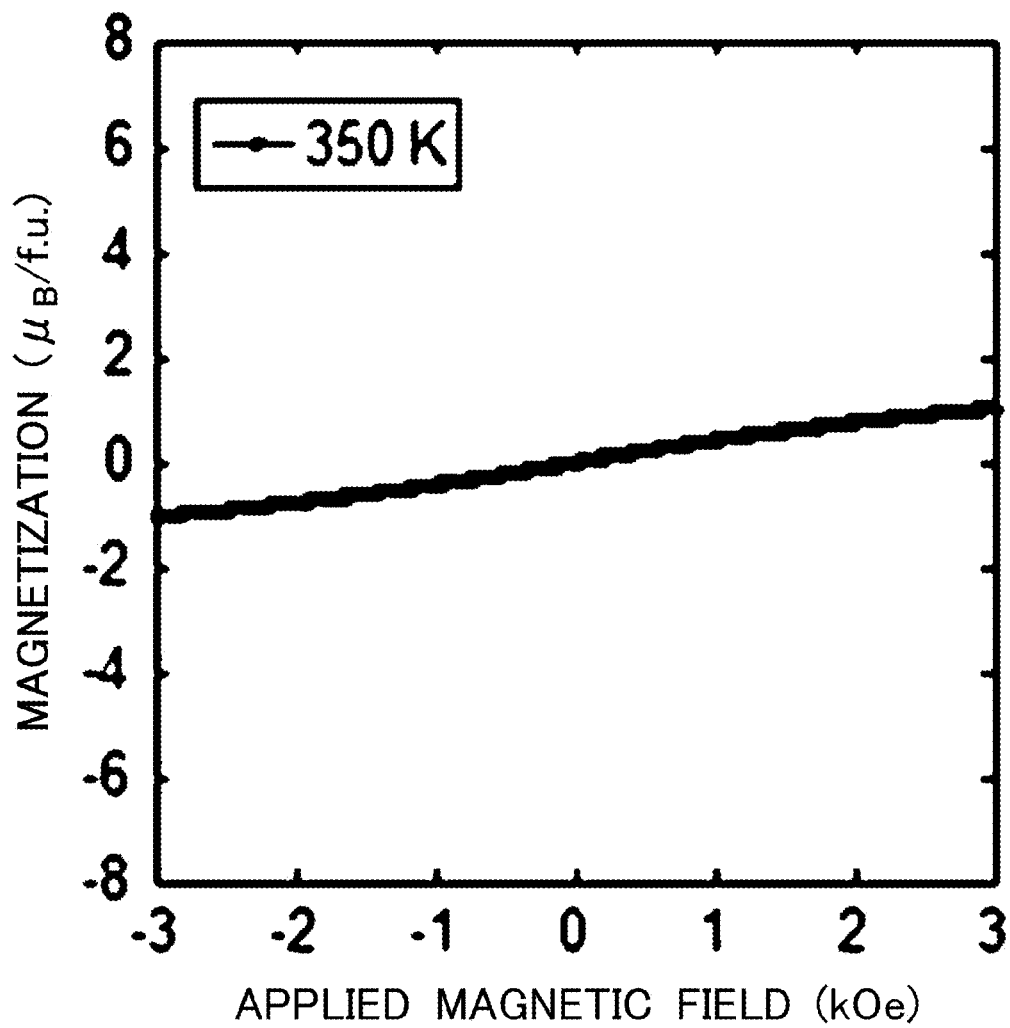
FIG. 23F shows a magnetic field dependency of a magnetization of $0.7Fe_5Ni_3Si_2+0.3Cr_3Ni_5Si_2$ at 350K.

FIG. 22 shows a temperature dependency of a magnetization of a mixed crystal of $(1-x)Fe_5Ni_3Si_2+xCr_3Ni_5Si_2$ at 0≤x≤0.4. $(1-x)Fe_5Ni_3Si_2+xCr_3Ni_5Si_2$ (0≤x≤0.4) is a soft magnet which has a wide transition temperature region from around 200K to around 650K. This behavior is ascribable to a helical magnetism. In particular, 0≤x≤0.3 where the magnetic transition temperature becomes above 20 degree is important.

FIG. 23A to FIG. 23F show magnetic field dependencies of magnetization of a mixed crystal of $(1-x)Fe_5Ni_3Si_2+xCr_3Ni_5Si_2$ at x=0.3. FIG. 23A to FIG. 23F correspond to cases in which a temperature is respectively 2K, 50K, 100K, 200K, 300K, and 350K. Like a $Co_xZn_yMn_z$ shown in implementation examples 1 to 4, the mixed crystal of $(1-x)Fe_5Ni_3Si_2+xCr_3Ni_5Si_2$ of the present example shows a linearity with respect to a magnetic field intensity until 1 kOe, and shows soft magnetic characteristics. Also, because this crystal structure belongs to a crystal structure of $P2_13$ space group which shows a helical crystal structure, so this crystal structure has a crystal phase of skyrmion. Also, because the magnetic transition temperature is above 20 degree, the structure has a crystal phase of skyrmion above 20 degree.

As explained above, a material which has the $Au_4Al$ type crystal structure has a crystal phase of skyrmion above zero temperature. For example, a material which has the $Au_4Al$ type crystal structure is formed by a material which is made of a chemical formula $A_xB_yC_z$ using multiple elements A, B, and C, and a configuration ratio of a and b with x+y=a, z=b satisfies 4:1. More specifically, there are $Au_4Al$, $Cu_4Al$, $Fe_{4-x}Ni_xP$, $Cr_{4-x}Ni_xSi$, $Fe_{4-x}Ni_xSi$, $Ir_{4-x}Mn_xSi$, $Ge_{4-x}Mn_xGe$, $Cu_{4-x}Sn_xAu$, $V_{4-x}Ga_xAu$, $Ta_{4-x}Ga_xAu$, $Nb_{4-x}Ga_xA_u$, $Ag_{4-x}Si_xAl$, and $Mn_xNi_ySi_z$(x+y+z=20) for an $Au_4Al$ type crystal structure. Also, a mixed crystal between these also has an $Au_4Al$ type structure.

For example, the material which has the $Au_4Al$ type crystal structure is a mixed crystal $M_{1-d}N_d$ (0≤d≤1) between a material M which is made of a chemical formula $A_{x1}B_{y1}C_{z1}$ using multiple elements A, B, and C, and in which a configuration ratio of $a_1$ and $b_1$ with $x_1+y_1=a_1$, $z_1=b_1$ satisfies 4:1, and a material N which is made of a chemical formula $A'_{x2}B'_{y2}C'_{z2}$ using multiple elements A', B', and C', and in which a configuration ratio of $a_2$ and $b_2$ with $x_2+y_2=a_2$, $z_2=b_2$ satisfies 4:1. The material which has the $Au_4Al$ type crystal structure used for the present embodiment may be selected from a magnet which includes a magnetic element among these. Furthermore, if a material which has a magnetic transition temperature which is above 20 degree is selected, the crystal phase of skyrmion can be present at a temperature which is above 20 degree.

Conventionally, it was only in a B20 type crystal structure such as FeGe and MnSi that presence of a skyrmion crystal lattice was confirmed in an chiral magnet alloy. In the present specification, it is confirmed that a skyrmion crystal lattice is present in a β-Mn type crystal structure and an $Au_4Al$ type crystal structure of a chiral magnet. Furthermore, it is revealed that these skyrmion crystal lattices are present above zero temperature. It greatly leads to practical development of the skyrmion memory. The skyrmion memory is a non-volatile memory which can perform data storage at high speed. This is a new great feature, and is clearly different from a conventional memory.

Figure 24:
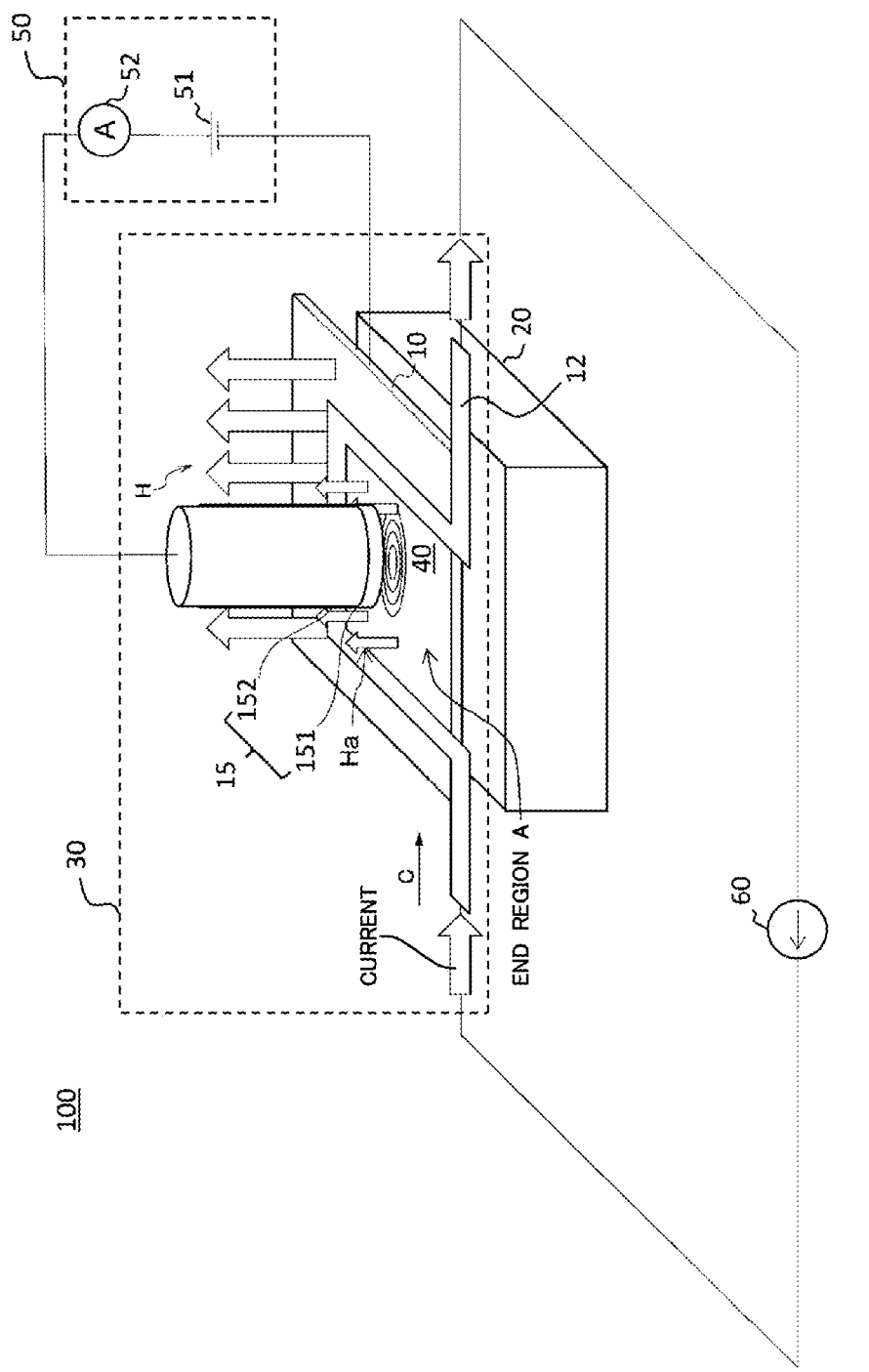
FIG. 24 shows a configuration example of a skyrmion memory 100.

FIG. 24 shows a configuration example of a skyrmion memory 100. The skyrmion memory 100 saves bit information using the skyrmion 40.

For example, presence or absence of the skyrmion 40 in a magnet 10 corresponds to one bit of information. The skyrmion memory 100 of the present example comprises a magnetic element 30, a generating unit of magnetic field 20, a measuring unit 50 and a power supply for coil current 60.

The magnetic element 30 can generate and erase the skyrmion 40. The magnetic element 30 of the present example is an element which is formed in a thin layer shape with thickness less than or equal to 500 nm.

For example, it is formed using techniques such as MBE (Molecular Beam Epitaxy) or sputtering. The magnetic element 30 has a magnet 10, a current path 12, and a skyrmion sensor 15.

The magnet 10 expresses at least a crystal phase of skyrmion and a helical magnetic phase depending on a magnetic field to apply. The crystal phase of skyrmion refers to a material in which the skyrmion 40 may occur in the magnet 10. For example, the magnet 10 is formed by materials shown in implementation examples 1 to 4.

The magnet 10 has a structure surrounded by a non-magnetic material. The structure surrounded by a non-magnetic material refers to a structure in which all directions of the magnet 10 are surrounded by the non-magnetic material. The magnet 10 may be formed in a thin layer shape. The magnet 10, for example, may have thickness which is approximately less than or equal to ten times of the diameter of the skyrmion 40. Also, at least a part of the magnet 10 is formed as a two-dimensional material. The two-dimensional material refers to a material in which thickness of the magnet 10 is less than or equal to 100 nm, and thickness of the magnet 10 is adequately thin with respect to the front surface of the magnet 10.

The current path 12 is one example of a skyrmion controlling unit, and controls generating and erasing of the skyrmion 40. The current path 12 surrounds a region which includes an end portion of the magnet 10 on one surface of the magnet 10. The current path 12 may be electrically isolated from the magnet 10 using insulating materials or the like. The current path 12 of the present example is a circuit for coil current which is formed in a u-shape. The u-shape may be a shape including a right angle like FIG. 3, not only a shape with a round angle. The current path 12 may not form a region which is closed on the xy plane. Combination of the current path 12 and an end portion may form a region which is closed on a front surface of the magnet 10. The current path 12 connects to the power supply for coil current 60 and flows a coil current. By flowing the coil current to the current path 12, a magnetic field is generated with respect to the magnet 10. The current path 12 is formed by non-magnetic metal materials such as Cu, W, Ti, Al, Pt, Au, TiN, AlSi. In the present specification, a region surrounded by the current path 12 is referred to as a coil region $A_C$. Also, a coil region $A_C$ in the case where a region surrounded by the current path 12 includes an end portion of the magnet 10 is particularly referred to as an end region A. The current path 12 of the present example has a serial conduction path which crosses an end portion of the magnet 10 from a non-magnetic material side to a magnet 10 side at least once, and crosses from a magnet 10 side to a non-magnetic material side at least once, on the xy plane. Thereby, the current path 12 surrounds a region which includes the end portion of the magnet 10. Note that a magnetic field intensity in an end region A is Ha.

The skyrmion sensor 15 functions as a magnetic sensor for skyrmion detecting. The skyrmion sensor 15 detects generating and erasing of the skyrmion 40. For example, the skyrmion sensor 15 is a resistance element which changes a resistance value depending on presence or absence of the skyrmion 40. The skyrmion sensor 15 of the present example is a tunnel magneto-resistance element (TMR element). The skyrmion sensor 15 has a stack structure of a non-magnetic material thin film 151 and a magnetic metal 152 which is in contact with a front surface of the magnet 10 on one surface of the magnet 10.

The magnetic metal 152 comes into a ferromagnetic phase which has an upward magnetic moment due to an upward magnetic field from the magnet 10. A measuring unit 50 is connected between the magnet 10 and an end portion on the opposite side to the magnet 10 side of the magnetic metal 152. Thereby, a resistance value of the skyrmion sensor 15 can be detected. A resistance value of the skyrmion sensor 15 when the skyrmion 40 is not present in the magnet 10 shows a minimum value, and the resistance value increases when the skyrmion 40 is present. The resistance value of the skyrmion sensor 15 is determined by a probability of a tunnel current of an electron of the non-magnetic material thin film 151 depending on a direction of the magnetic moment of the magnet 10 and the magnetic metal 152 which comes into a ferromagnetic phase. A high resistance (H) and a low resistance (L) of the skyrmion sensor 15 corresponds to presence or absence of the skyrmion 40, and corresponds to information "1" and "0" which is stored in a memory cell of information.

The generating unit of magnetic field 20 is provided being opposite to the magnet 10. The generating unit of magnetic field 20 generates an applied magnetic field H, and applies perpendicularly to a two-dimensional plane of the magnet 10, in a direction from a rear surface of the magnet 10 to a front surface of the magnet 10.

The rear surface of the magnet 10 refers to a surface on the generating unit of magnetic field 20 side of the magnet 10. Note that in the present embodiment only a single generating unit of magnetic field 20 is used. However, if the generating unit of magnetic field 20 is what can apply a magnetic field perpendicularly with respect to the magnet 10, multiple generating units of magnetic field 20 may be used. The number and the disposition of the generating unit of magnetic field 20 is not limited to this.

The measuring unit 50 comprises a power supply for measuring 51 and an ammeter 52. The power supply for measuring 51 is provided between the magnet 10 and the skyrmion sensor 15. The ammeter 52 measures a current for measuring which flows from the power supply for measuring 51. For example, the ammeter 52 is provided between the power supply for measuring 51 and the skyrmion sensor 15. The measuring unit 50 can detect presence or absence of the skyrmion 40 with little electrical power by using the skyrmion sensor 15 with high sensitivity.

The power supply for coil current 60 is connected to the current path 12, and flows a current in a direction shown by an arrow C. The current which is made to flow to the current path 12 generates a magnetic field from a front surface to a rear surface of the magnet 10 in a region surrounded by the current path 12. Because a direction of a magnetic field which a current which is flown to the current path 12 induces is opposite to a direction of a uniform magnetic field H from the generating unit of magnetic field 20, at a coil region $A_C$, a magnetic field Ha which is weakened to a front surface direction from a rear surface of the magnet 10 occurs. As a result, the skyrmion 40 can be generated in the coil region $A_C$. Note that in the case in which the skyrmion 40 is erased, the power supply for coil current 60 may flow a coil current in an opposite direction to the case in which the skyrmion 40 is generated. Also, in the case in which multiple current paths 12 are provided, multiple power supplies for coil current 60 may be provided depending on the number of the current paths 12.

Figure 25:
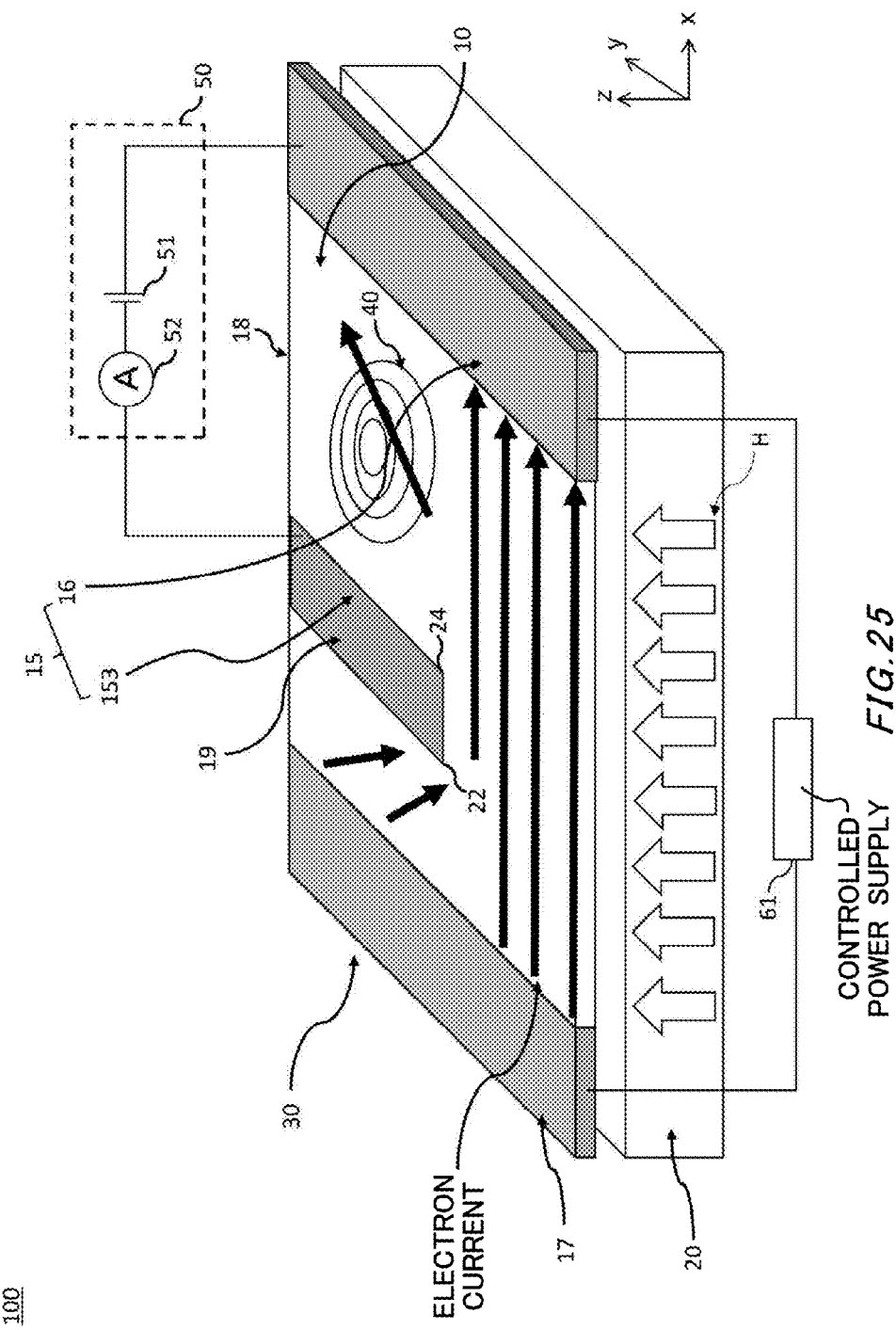
FIG. 25 shows a configuration example of a skyrmion memory 100.

FIG. 25 is a schematic view showing a configuration example of a skyrmion memory 100. The skyrmion memory 100 stores information by allowing to generate and erase the skyrmion 40 by a current. For example, presence or absence of the skyrmion 40 at a predetermined location of a magnet 10 corresponds to one bit of information.

The skyrmion memory 100 of the present example comprises a magnetic element 30, a generating unit of magnetic field 20, a controlled power supply 61 and a measuring unit 50.

The magnetic element 30 can generate, erase and detect a skyrmion 40 by an applied current. The magnetic element 30 of the present example has a magnet 10, an non-magnetic metal at upstream side 16, a non-magnetic metal at downstream side 17 and a electrode with notch structure 153. The non-magnetic metal at upstream side 16 and the electrode with notch structure 153 configure a skyrmion sensor 15.

The non-magnetic metal at upstream side 16 is connected to the magnet 10. The non-magnetic metal at upstream side 16 is connected to a spreading direction of the magnet 10. In the present example, the spreading direction of the magnet 10 refers to a direction which is parallel to an xy plane. The non-magnetic metal at upstream side 16 may have a thin layer shape. Also, the non-magnetic metal at upstream side 16 may have the same thickness as the magnet 10.

The non-magnetic metal at downstream side 17 is apart from the non-magnetic metal at upstream side 16 and connects to the magnet 10. The non-magnetic metal at downstream side 17 may connect to a spreading direction of the magnet 10. The non-magnetic metal at upstream side 16 and the non-magnetic metal at downstream side 17 are arranged so as to flow a current which is in a direction approximately parallel to the xy plane to the magnet 10 in the case of applying a voltage. The non-magnetic metal at upstream side 16 and the non-magnetic metal at downstream side 17 are made of conductive non-magnetic metals such as Cu, W, Ti, TiN, Al, Pt, Au.

The controlled power supply 61 connects to the non-magnetic metal at upstream side 16 and the non-magnetic metal at downstream side 17. The controlled power supply 61 selects any of a direction from the non-magnetic metal at upstream side 16 toward the non-magnetic metal at downstream side 17 and a direction from the non-magnetic metal at downstream side 17 toward the non-magnetic metal at upstream side 16, and flows a current to the magnet 10. The controlled power supply 61 applies a current to the magnet 10 in the direction from the non-magnetic metal at upstream side 16 toward the non-magnetic metal at downstream side 17 when the skyrmion 40 occurs in the magnet 10. Also, controlled power supply 61 applies a current to the magnet 10 in the direction from the non-magnetic metal at downstream side 17 toward the non-magnetic metal at upstream side 16 when the skyrmion 40 which is present in the magnet 10 is erased.

The magnet 10 has a position with notch structure 19 in an end portion 18. The end portion 18 in the present example is an end portion sandwiched between the non-magnetic metal at upstream side 16 and the non-magnetic metal at downstream side 17 among end portions of the magnet 10. In a more specific example, the end portion 18 is an upper side end portion of the magnet 10 in the case when the non-magnetic metal at upstream side 16 is arranged on the right side and the non-magnetic metal at downstream side 17 is arranged on the left side. The position with notch structure 19 is provided being apart from both the non-magnetic metal at upstream side 16 and the non-magnetic metal at downstream side 17 in the end portion 18. A non-magnetic material may be provided inside the position with notch structure 19.

The skyrmion memory 100 uses the skyrmion 40 which occurs by a current from the controlled power supply 61 for an information storage medium. In FIG. 25, a direction of an electron current is shown by an arrow (a direction of a current is opposite to this). By this electron current, the skyrmion 40 can be generated from the position with notch structure 19 of the magnet 10.

In the present example, the skyrmion 40 is generated near a corner portion 24 of the position with notch structure 19. In the present example, the corner portion 24 is a corner portion on the non-magnetic metal at upstream side 16 side in a region which projects the most inside the magnet 10 in the position with notch structure 19. The position with notch structure 19 has at least two corner portions in the region which projects the most inside the magnet 10. The position with notch structure 19 may have a side parallel to the non-magnetic metal at upstream side 16 and a side parallel to the non-magnetic metal at downstream side 17. The corner portion 24 may be an end portion of the side parallel to the non-magnetic metal at upstream side 16. The position with notch structure 19 of the present example has a square shape. The magnet 10 surrounds three sides of the position with notch structure 19. The remaining one side of the position with notch structure 19 is a straight line which interpolates between end portions 18 on the both sides of the position with notch structure 19. In this case, the corner portion 24 is a corner portion which is nearer to the non-magnetic metal at upstream side 16 among the two corner portions at the leading edge of the position with notch structure 19. However, the shape of the position with notch structure 19 is not limited to a square. The shape of the position with notch structure 19 may be a polygon. Also, each side of the position with notch structure 19 may not be a straight line. Also, a leading edge of at least one corner portion of the position with notch structure 19 may have roundness.

The magnet 10 becomes a ferromagnetic phase due to the generating unit of magnetic field 20. For this reason, the magnetic moment in the magnet 10 is oriented in the same direction as a magnetic field H. However, a magnetic moment at an end portion of the magnet 10 is not oriented in the same direction as the magnetic field H, but has an inclination with respect to the magnetic field H. In particular, near the corner portion of the position with notch structure 19, an inclination of the magnetic moment continuously changes. For this reason, the skyrmion 40 tends to be generated more in a corner portion of the magnet 10 compared to in other regions, and the skyrmion 40 can be generated by a predetermined electron current.

The position with notch structure 19 has at least two corner portions whose inside corner forms an obtuse angle in the region which projects the most inside the magnet 10. Among the corner portions, an inside corner of the corner portion 24 which is adjacent to the non-magnetic metal at upstream side 16 is greater than or equal to 180 degrees. Also, an inside corner of the corner portion 22 which is adjacent to the non-magnetic metal at downstream side 17 may also be greater than or equal to 180 degrees. Here, an inside corner of a corner portion in the position with notch structure 19 refers to an angle on the magnet 10 side of the corner portion 24. For example, in the example in FIG. 25, an inside corner of the corner portion 24 which is adjacent to the non-magnetic metal at upstream side 16 is 270 degrees.

In the case in which the inside corner of the corner portion 24 is 270 degrees, a magnetic moment near the corner portion 24 in the state in which a current is not applied is closest to a vortex state. For this reason, in generating of the skyrmion 40, the inside corner of the corner portion 24 is preferably 270 degrees.

Also, by flowing a current to the magnet 10 from the non-magnetic metal at downstream side 17 to the non-magnetic metal at upstream side 16, a direction of an electron current is opposite to FIG. 25. The electron current in an opposite direction presses the skyrmion 40 to a region between the position with notch structure 19 and the non-magnetic metal at downstream side 17. The region has a width to a degree so as not to maintain the skyrmion 40. For this reason, the skyrmion 40 can be erased. Here, a width refers to a length in a direction which a current flows to the magnet 10 (the y-axis direction in the present example). On the other hand, a region between the position with notch structure 19 and the non-magnetic metal at upstream side 16 has a width to a degree so as to maintain the skyrmion 40. That is, the region between the position with notch structure 19 and the non-magnetic metal at upstream side 16 has a bigger width than a region between the position with notch structure 19 and the non-magnetic metal at downstream side 17.

Note that the position with notch structure 19 of the present example has the electrode with notch structure 153 which is made of a non-magnetic metal and is connected to the magnet 10 in a spreading direction of the magnet 10. Also, the non-magnetic metal at upstream side 16, in addition to functioning as an electrode for generating and erasing of the skyrmion 40, also functions as an electrode in the skyrmion sensor 15. The skyrmion sensor 15 detects generating and erasing of the skyrmion 40. For example, the skyrmion sensor 15 is a resistance element which changes a resistance value depending on presence or absence of the skyrmion 40.

The electrode with notch structure 153 is in contact with a side which is opposite to the non-magnetic metal at upstream side 16 in the position with notch structure 19. Note that as shown in FIG. 25, the whole position with notch structure 19 may be the electrode with notch structure 153. The electrode with notch structure 153 sandwiches a location at which the skyrmion 40 in a stable state is present with the non-magnetic metal at upstream side 16. In the present example, depending on generating and erasing of the skyrmion 40, a resistance value of the magnet 10 between the non-magnetic metal at upstream side 16 and the electrode with notch structure 153 changes. A resistance value of the skyrmion sensor 15 when the skyrmion 40 is not present in the magnet 10 shows a minimum value, and the resistance value increases when the skyrmion 40 is present. A high resistance (H) and a low resistance (L) of the skyrmion sensor 15 corresponds to presence or absence of the skyrmion 40, and corresponds to information "1" and "0" which a memory cell stores.

The measuring unit 50 is connected to the electrode with notch structure 153 and the non-magnetic metal at downstream side 17. The measuring unit 50 measures a resistance value of the magnet 10 between the electrode with notch structure 153 and the non-magnetic metal at downstream side 17. A resistance value between the electrode with notch structure 153 and the non-magnetic metal at downstream side 17 corresponds to the resistance value of the magnet 10, and changes depending on generating and erasing of the skyrmion 40. For example, when the skyrmion 40 is not present, a spatially-uniform magnetic field H occurs in the magnet 10. On the other hand, when the skyrmion 40 is present, a magnetic field applied to the magnet 10 is not spatially uniform. When a magnetic field which is not spatially uniform occurs, a conduction electron which flows in the magnet 10 is scattered by a magnetic moment of the magnet 10. That is, the resistance value of the magnet 10 becomes higher in the case in which the skyrmion 40 is present than in the case in which the skyrmion 40 is not present.

The measuring unit 50 of the present example has a power supply for measuring 51 and an ammeter 52. The power supply for measuring 51 is provided between the electrode with notch structure 153 and the non-magnetic metal at downstream side 17. The ammeter 52 measures a current for measuring which flows from the power supply for measuring 51. A resistance value of the magnet 10 can be detected from a ratio of a known voltage which is applied by the power supply for measuring 51 and a current measured by the ammeter 52. Thereby, information that the skyrmion memory 100 saves can be read.

The skyrmion memory 100 having the above-mentioned configurations can be embodied as a magnetic element which can transfer and erase the skyrmion 40 in the magnet 10. In this case, the non-magnetic metal at upstream side 16, the non-magnetic metal at downstream side 17 and the controlled power supply 61 operate as a skyrmion controlling unit which controls generating, erasing and transferring of the skyrmion 40.

Figure 26:
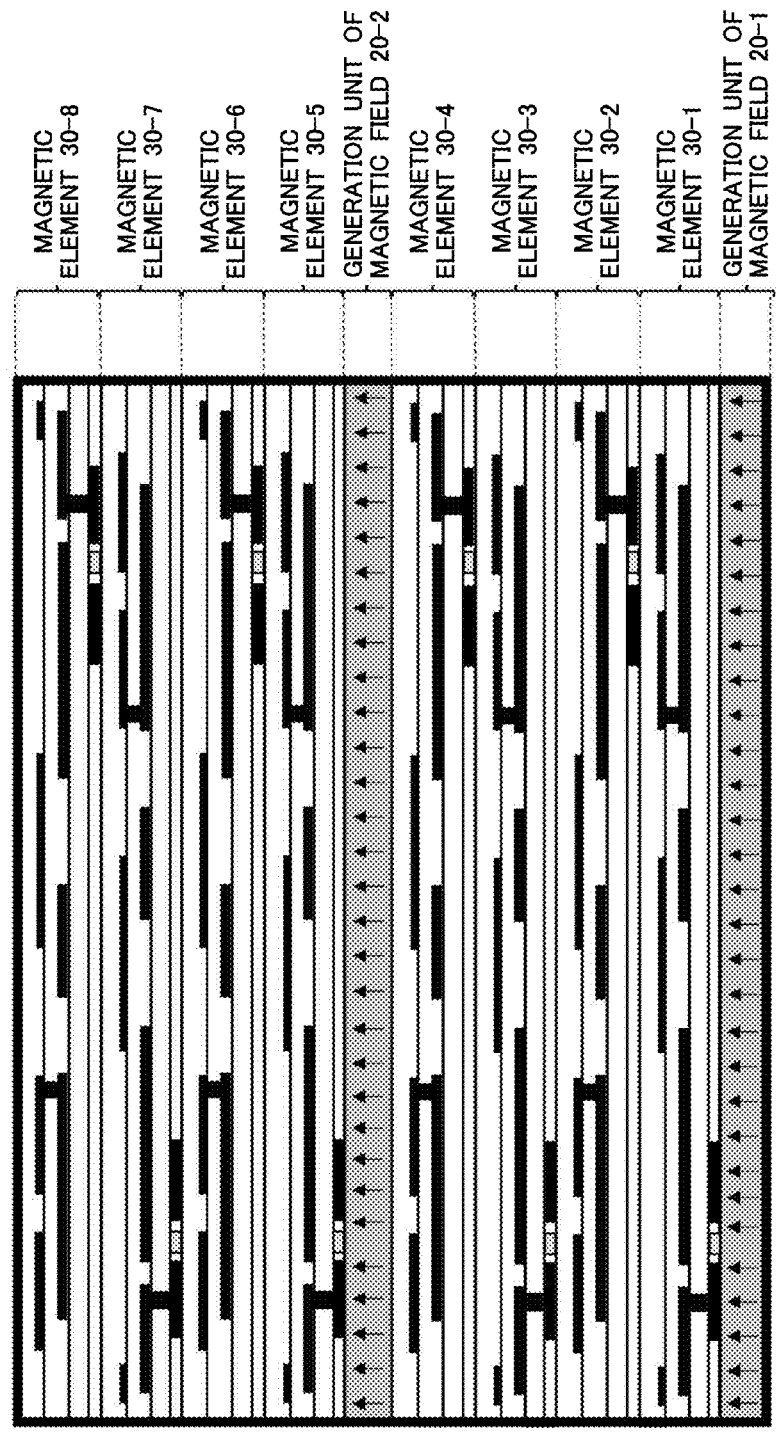
FIG. 26 shows a configuration example of a skyrmion memory device 110.

FIG. 26 shows a skyrmion memory 100 which has multiple generating units of magnetic field 20. The skyrmion memory 100 of the present example has eight magnetic elements 30 in total from a magnetic element 30-1 to a magnetic element 30-8. The skyrmion memory 100 has four magnetic elements 30 on a generating unit of magnetic field 20-1. The skyrmion memory 100 further has a generating unit of magnetic field 20-2 between a magnetic element 30-4 and a magnetic element 30-5. Thereby, the magnetic element 30 can keep an intensity of an magnetic field which is received from the generating units of magnetic field 20 constant. The generating units of magnetic field 20 may be arranged at appropriate intervals depending on a material of the magnetic element 30 or the like.

Figure 27:
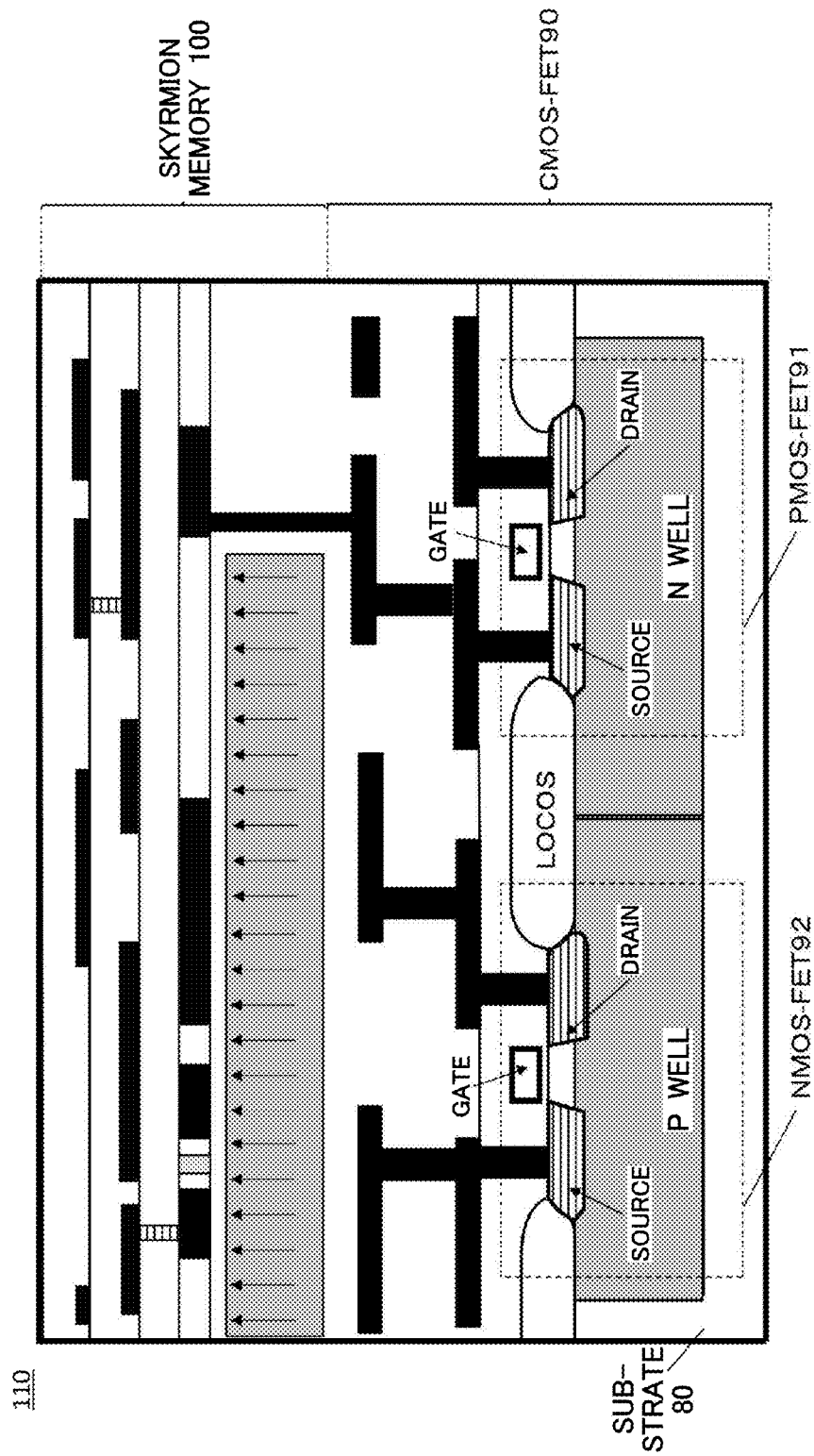
FIG. 27 shows a configuration example of a skyrmion memory device 110.

FIG. 27 shows a configuration example of a skyrmion memory device 110 which has a semiconductor element. The skyrmion memory device 110 of the present example comprises a CMOS-FET 90 which configures the skyrmion memory 100 and a CPU functionality. The skyrmion memory 100 is formed on the CMOS-FET 90. The CMOS-FET 90 of the present example has a PMOS-FET91 and a NMOS-FET92 which are formed on a substrate 80. The skyrmion memory device 110 can have a CMOS-FET 90 which configures the CPU functionality and the skyrmion memory 100 which is a stacked large-scale non-volatile memory within the same chip. As a result, shortening of the CPU processing time and acceleration is achieved, and a CPU power consumption can be significantly reduced.

Figure 28:
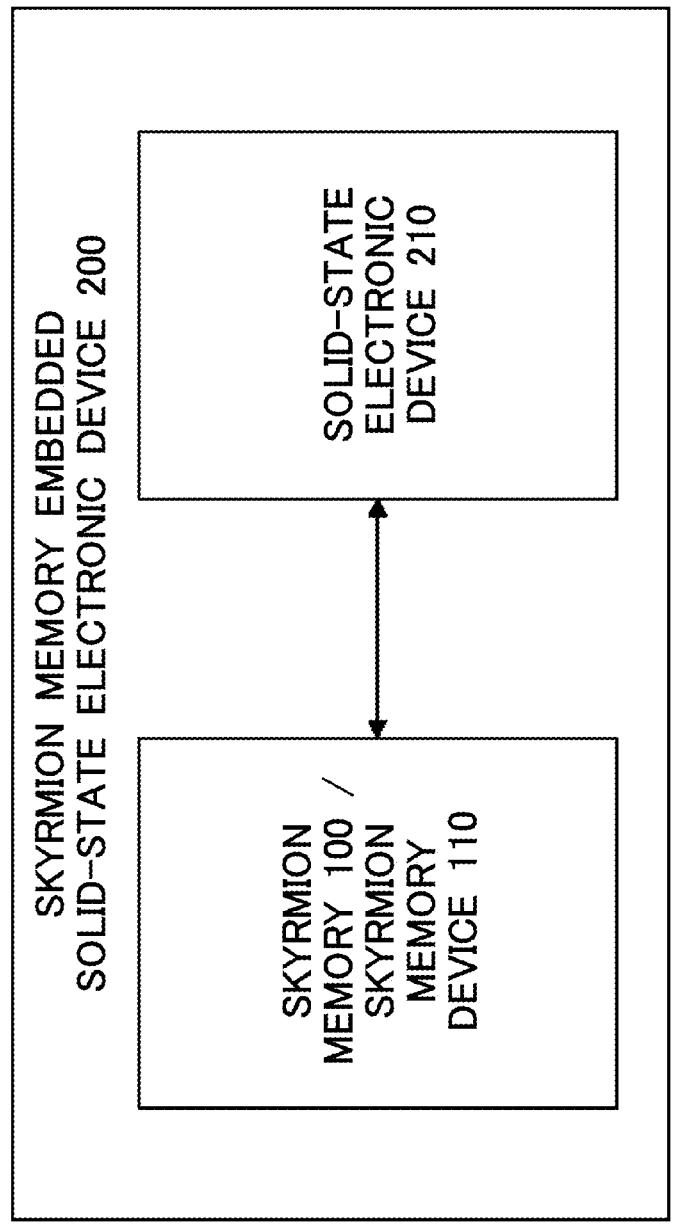
FIG. 28 is a schematic view showing a configuration example of a skyrmion memory embedded solid-state electronic device 200.

FIG. 28 is a schematic view showing a configuration example of a skyrmion memory embedded solid-state electronic device 200. The skyrmion memory embedded solid-state electronic device 200 comprises a skyrmion memory 100 or a skyrmion memory device 110, and a solid-state electronic device 210. The skyrmion memory 100 or the skyrmion memory device 110 is the skyrmion memory 100 or the skyrmion memory device 110 described in from FIG. 24 to FIG. 27. The solid-state electronic device 210 is, for example, a CMOS-LSI device. The solid-state electronic device 210 has at least one functionality of writing data to the skyrmion memory 100 or the skyrmion memory device 110, and reading data from the skyrmion memory 100 or the skyrmion memory device 110.

Figure 29:
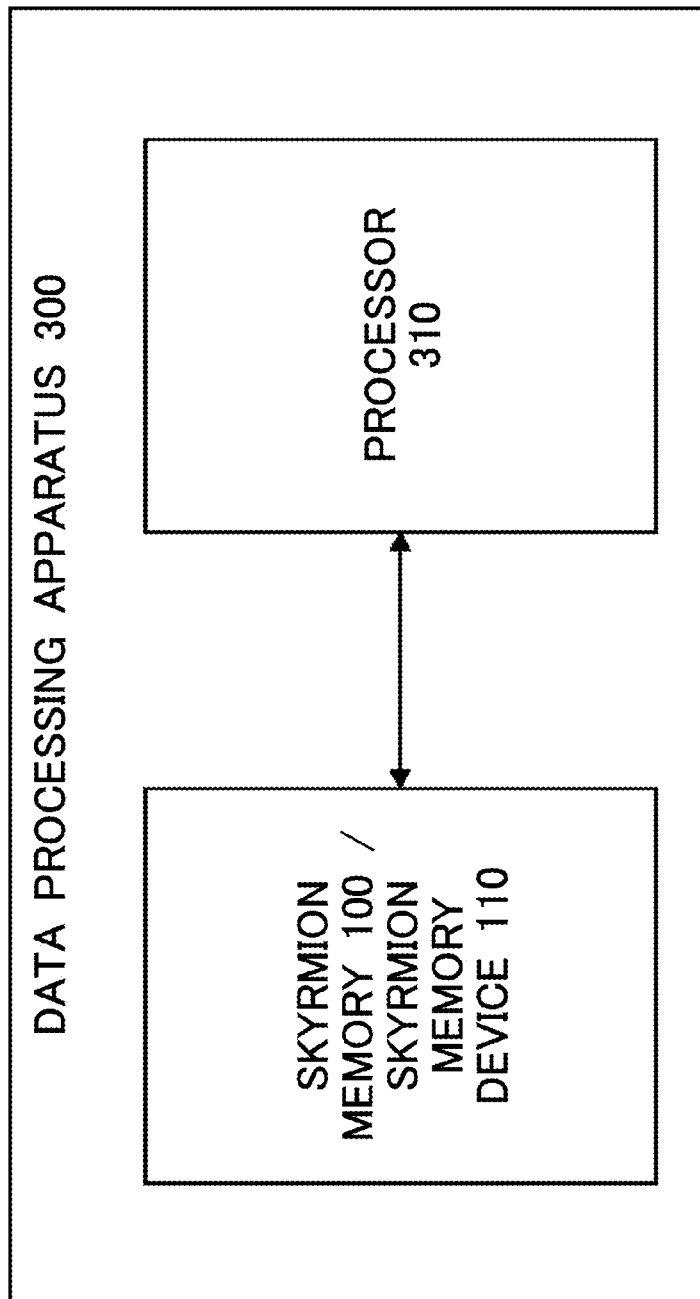
FIG. 29 is a schematic view showing a configuration example of a data processing apparatus 300.

FIG. 29 is a schematic view showing a configuration example of a data processing apparatus 300. The data processing apparatus 300 comprises a skyrmion memory 100 or a skyrmion memory device 110, and a processor 310. The skyrmion memory 100 or the skyrmion memory device 110 is the skyrmion memory 100 or the skyrmion memory device 110 described in from FIG. 24 to FIG. 27. The processor 310 has, for example, a digital circuit which processes a digital signal. The processor 310 has at least one functionality of writing data to the skyrmion memory 100 or the skyrmion memory device 110, and reading data from the skyrmion memory 100 or the skyrmion memory device 110.

Figure 30:
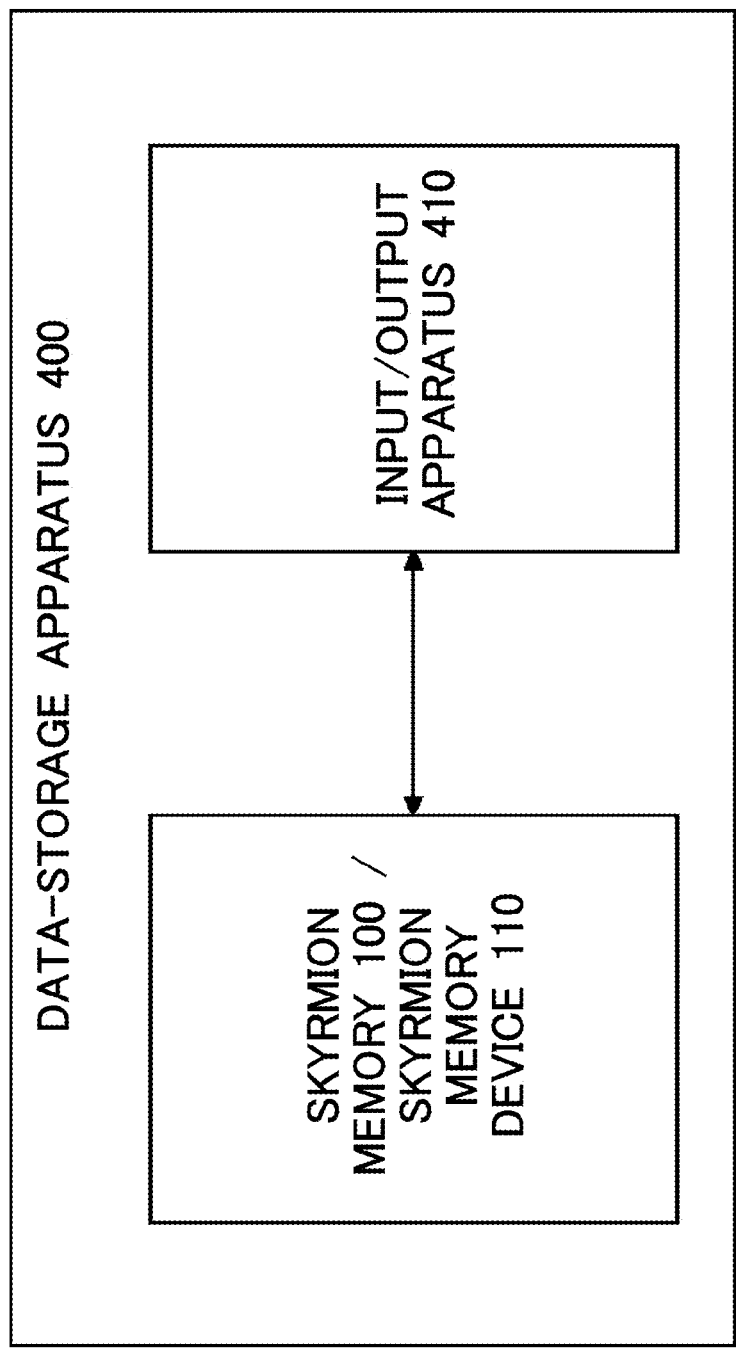
FIG. 30 is a schematic view showing a configuration example of a data recording apparatus 400.

FIG. 30 is a schematic view showing a configuration example of a data recording apparatus 400. The data recording apparatus 400 comprises a skyrmion memory 100 or a skyrmion memory device 110, and an input/output apparatus 410. The data recording apparatus 400 is, for example, a memory device such as a hard disk or a USB memory. The skyrmion memory 100 or the skyrmion memory device 110 is the skyrmion memory 100 or the skyrmion memory device 110 described in from FIG. 24 to FIG. 27. The input/output apparatus 410 has at least one functionality of writing data to the skyrmion memory 100 or the skyrmion memory device 110 from the outside, and reading data from the skyrmion memory 100 or the skyrmion memory device 110 and outputting to the outside.

Figure 31:
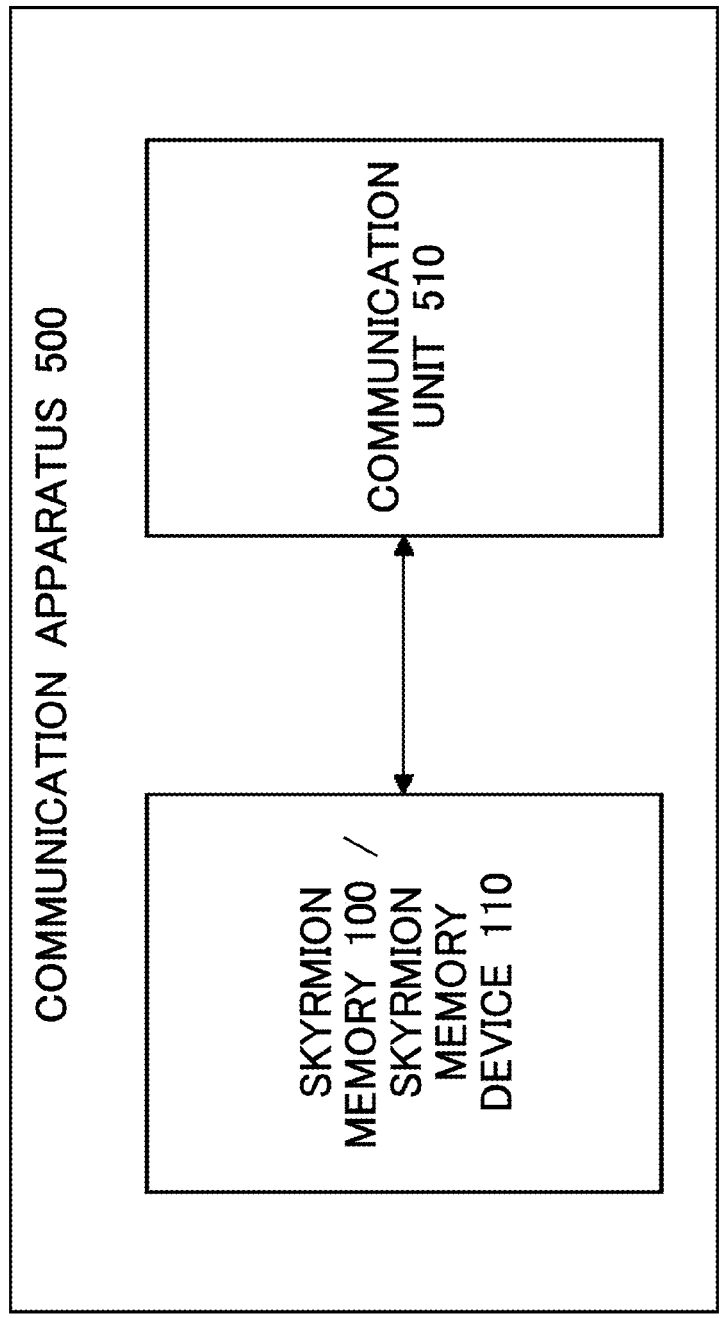
FIG. 31 is a schematic view showing a configuration example of a communication apparatus 500.
Figure 32:
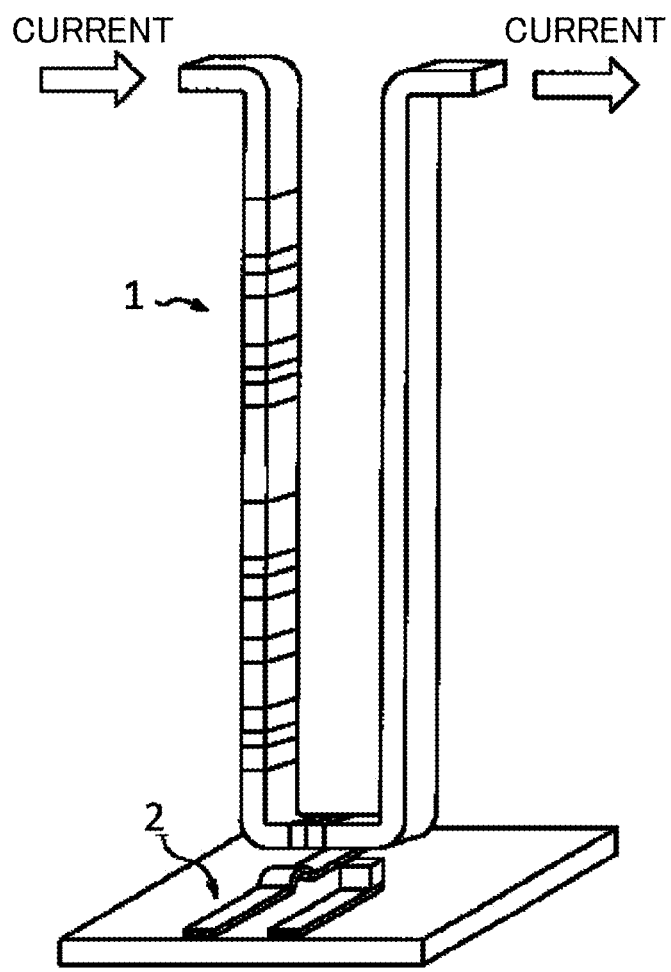
FIG. 32 is a diagram showing a principle of driving of magnetic domain by a current.

FIG. 31 is a schematic view showing a configuration example of a communication apparatus 500. The communication apparatus 500 refers to, for example, whole devices which have communication functionalities with the outside, such as mobilephones, smartphones, and tablet type terminals. The communication apparatus 500 may be portable, or may be non-portable. The communication apparatus 500 comprises a skyrmion memory 100 or a skyrmion memory device 110, and a communication unit 510. The skyrmion memory 100 or the skyrmion memory device 110 is the skyrmion memory 100 or the skyrmion memory device 110 described in from FIG. 24 to FIG. 27. The communication unit 510 has a communication functionality with the outside of the communication apparatus 500. The communication unit 510 may have a wireless communication functionality, or may have a wired communication functionality, or may have both a wireless communication functionality and a wired communication functionality. The communication unit 510 has at least one functionality to write data received from the outside to the skyrmion memory 100 or the skyrmion memory device 110, a functionality to send data read from the skyrmion memory 100 or the skyrmion memory device 110 to the outside, and a functionality to operate based on controlling information which the skyrmion memory 100 or the skyrmion memory device 110 stores.

Also, because saving of an electrical power in an electronic device to which the skyrmion memory 100 or the skyrmion memory device 110 is applied can also be achieved, prolonging a mounted battery can be achieved. This allows providing a further epoch-making specification to the user side in a mobile electronic device to which the skyrmion memory 100 or the skyrmion memory device 110 is applied. From a personal computer, image storage apparatus or the like, any may be available as an electronic device.

Also about communication apparatuses mounting CPU (mobilephones, smartphones, tablet type terminals or the like), because capturing of image information, or operations of various large-scale application programs can be achieved at higher speed, and also high-speed responsibility can be achieved by applying the skyrmion memory 100 or the skyrmion memory device 110, this allows ensuring comfortable usage enviornment for the user. Also, because acceleration of image display to display on a screen or the like can also be achieved, its usage enviornment can be further improved.

Also, by applying the skyrmion memory 100 or the skyrmion memory device 110 to electronic devices such as digital cameras, this allows recording videos at mass storage. Also, by applying the skyrmion memory 100 or the skyrmion memory device 110 to electronic devices such as 4K television receivers, this can achieve enhancing the capacity of its image storage. As a result, this allows eliminating the need for connection of an external hard disk in a television receiver. Also, the skyrmion memory 100 or the skyrmion memory device 110 may be embodied as a data recording medium, in addition to the case to apply to data recording apparatuses from hard disks.

Also, with respect to electronic devices such as automotive navigation systems, by applying this skyrmion memory 100 or the skyrmion memory device 110, further high functionalization can be achieved, and this also allows storing a larger amount of map information simply.

Also, the skyrmion memory 100 or the skyrmion memory device 110 can be expected to have a big impact when practically using an self-traveling device and a flying device. That is, a complicated controlling process of the flying device, weather information process, improvement of service for passengers by providing projected images with high definition image quality, in addition, controlling of space aircrafts and recording massive recorded information of observed image information, which gives much knowledge to human beings.

Also, because the skyrmion memory 100 or the skyrmion memory device 110 is a magnetic memory, it has a high resistance with respect to high-energy particles which fly about in space. The skyrmion memory 100 or the skyrmion memory device 110 has an advantage that is largely different from a flash memory which uses an electrical charge accompanied by an electron as a storage holding medium. For this reason, it is important as a storage medium such as a space aircraft.

EXPLANATION OF REFERENCES

1 . . . magnetic shift register, 2 . . . magnetic sensor, 10 . . . magnet, 11 . . . sample, 12 . . . current path, 15 . . . skyrmion sensor, 16 . . . non-magnetic metal at upstream side, 17 . . . non-magnetic metal at downstream side, 18 . . . end portion, 19 . . . position with notch structure, 20 . . . generating unit of magnetic field, 22 . . . corner portion, 24 . . . corner portion, 30 . . . magnetic element, 40 . . . skyrmion, 50 . . . measuring unit, 51 . . . power supply for measuring, 52 . . . ammeter, 60 . . . power supply for coil current, 61 . . . controlled power supply, 80 . . . substrate, 90 . . . CMOS-FET, 91 . . . PMOS-FET, 92 . . . NMOS-FET, 100 . . . skyrmion memory, 110 . . . skyrmion memory device, 151 . . . non-magnetic material thin film, 152 . . . magnetic metal, 153 . . . electrode with notch structure, 200 . . . skyrmion memory embedded solid-state electronic device, 210 . . . solid-state electronic device, 300 . . . data processing apparatus, 310 . . . processor, 400 . . . data recording apparatus, 410 . . . input/output apparatus, 500 . . . communication apparatus, 510 . . . communication unit

What is claimed is:

1. A magnetic element with a chiral magnet for generating a skyrmion, wherein
   the chiral magnet is made of a magnetic material having a β-Mn type crystal structure or an $Au_4Al$ type crystal structure; and
   the magnetic material having the β-Mn type crystal structure is a mixed crystal $M_{1-d}N_d$ (0≤d≤1) between a material M which is made of a chemical formula $A_{x1}B_{y1}C_{z1}$ using multiple elements A, B, and C, and satisfies $x_1+y_1+z_1=20$ and $0≤x_1, y_1, z_1≤20$, and a material N which is made of a chemical formula $A'_{x2}B'_{y2}C'_{z2}$ using multiple elements A', B', and C', and satisfies $x_2+y_2+z_2=20$ and $0<x_2, y_2, z_2<20$.

2. A magnetic memory element with a chiral magnet configured to generate a skyrmion to represent data stored in the memory element, comprising:
   a chiral magnet made of a magnetic material having a β-Mn type crystal structure made of a chemical compound $Co_xZn_yMn_z$, and satisfying $x+y+z=20$ and $0≤x, y, z≤20$.

3. The magnetic memory element according to claim 2, wherein
   the chiral magnet is made of a magnet which is in a thin layer shape.

4. The magnetic memory element according to claim 3, wherein
   a thickness of a portion which is formed as a two-dimensional material of the chiral magnet is less than or equal to 100 nm.

5. The magnetic memory element according to claim 3, wherein
   the chiral magnet expresses at least a crystal phase of skyrmion and a ferromagnetic phase in which the skyrmion is generated, depending on an applied magnetic field.

6. A magnetic memory element, wherein
   a plurality of magnetic memory elements according to claim 3 are stacked in a thickness direction.

7. A skyrmion memory comprising:
   the magnetic memory element according to claim 2, and
   a generating unit of magnetic field which is provided opposite to the chiral magnet and applies a magnetic field to the chiral magnet.

8. A skyrmion memory embedded solid-state electronic device comprising the skyrmion memory according to claim 7, and a solid-state electronic device within a same chip.

9. A data recording apparatus with the skyrmion memory according to claim 7.

10. A data processing apparatus with the skyrmion memory according to claim 7.

11. A communication apparatus with the skyrmion memory according to claim 7.

12. The magnetic element with a chiral magnet for generating a skyrmion according to claim 2, wherein 0<z.

13. A method of implementing a computer memory cell with a magnetic element having a chiral magnet for generating a skyrmion at room temperature, comprising:
    generating a magnetic field in a direction from a front surface to a rear surface of a region of a sheet of magnetic material having a β-Mn type crystal structure, the magnetic material having a β-Mn type crystal structure with a mixed crystal $M_{1-d}N_d$ (0≤d≤1), the material M having a chemical formula $A_{x1}B_{y1}C_{z1}$ with multiple elements A, B, and C, and satisfies $x_1+y_1+z_1=20$ and $0≤x_1, y_1, z_1≤20$, and the material N having a chemical formula $A'_{x2}B'_{y2}C'_{z2}$ with multiple elements A', B', and C', and satisfies $x_2+y_2+z_2=20$ and $0<x_2, y_2, z_2<20$;

detecting a phase of a skyrmion memory cell defined by the region of the sheet of magnetic material;

wherein the detecting includes measurement of a resistance of a resistance element when located above the region of the skyrmion memory cell.

\* \* \* \* \*